(12) United States Patent
Arsovski et al.

(10) Patent No.: US 7,770,139 B2
(45) Date of Patent: *Aug. 3, 2010

(54) DESIGN STRUCTURE FOR A FLEXIBLE MULTIMODE LOGIC ELEMENT FOR USE IN A CONFIGURABLE MIXED-LOGIC SIGNAL DISTRIBUTION PATH

(75) Inventors: Igor Arsovski, Williston, VT (US); Anthony R. Bonaccio, Shelburne, VT (US); Hayden C. Cranford, Jr., Cary, NC (US); Joseph A. Iadanza, Hinesburg, VT (US); Pradeep Thiagarajan, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 293 days.

This patent is subject to a terminal disclaimer.

(21) Appl. No.: 11/931,626

(22) Filed: Oct. 31, 2007

(65) Prior Publication Data

US 2009/0108869 A1    Apr. 30, 2009

(51) Int. Cl.
G06F 17/50 (2006.01)
(52) U.S. Cl. .............................. 716/1; 716/2
(58) Field of Classification Search ............... 716/1, 716/2, 5, 16, 17; 326/26, 27, 37, 38, 63, 326/68, 80–83, 86, 87; 257/6, 11, 26, 107, 257/133, 369; 438/606
See application file for complete search history.

(56) References Cited

U.S. PATENT DOCUMENTS

| 6,040,710 | A | 3/2000 | Nakauchi | |
| 6,937,080 | B2 | 8/2005 | Hairapetian | |
| 7,038,495 | B2 | 5/2006 | Choi | |
| 7,061,273 | B2 | 6/2006 | Wang et al. | |
| 7,362,138 | B1 * | 4/2008 | Arsovski et al. | 326/83 |
| 7,403,039 | B1 * | 7/2008 | Arsovski et al. | 326/83 |
| 7,429,877 | B2 * | 9/2008 | Arsovski et al. | 326/83 |
| 2002/0057123 | A1 * | 5/2002 | King | 327/498 |

OTHER PUBLICATIONS

Notice of Allowance for related U.S. Appl. No. 11/670,537, mailed May 2, 2008.
Notice of Allowance for related U.S. Appl. No. 11/848,570, mailed May 19, 2008.
Notice of Allowance for parent U.S. Appl. No. 11/613,516, mailed Feb. 14, 2008.
Musicer, Jason, and Rabaey, Jan, "MOS Current Mode Logic for Low Power Mixed-Signal Digital Circuits," Jan. 2000.

(Continued)

Primary Examiner—Vuthe Siek
(74) Attorney, Agent, or Firm—Downs Rachlin Martin PLLC

(57) ABSTRACT

A design structure for a multimode circuit that is configured to operate in one of multiple operating modes is disclosed. In particular, an exemplary multimode circuit may be configured to operating in one of a full-swing mode, a limited-swing mode, a full-swing to limited-swing converter mode, and a limited-swing to full-swing converter mode. The operating modes of the multimode circuit may be dynamically selectable. One or more multimode circuits may be part of a configurable distribution path for controlling the performance of a signal distribution path or tree of an integrated circuit.

5 Claims, 15 Drawing Sheets

OTHER PUBLICATIONS

Musicer, Jason, "An Analysis of MOS Current Logic for Low Power and High Performance Digital Logic," M.S. 2000 (advisor: Jan Rabaey).

Mizuno, Masayuki, Yamashina, Masakazu, Furuta, Koichiro, Igura, Hiroyuki, Abiko, Hitoshi, Okabe, Kazuhiro, Ono, Atsuki, and Yamada, Hachiro, "A GHz MOS Adaptive Pipeline Technique Using MOS Current-Mode Logic," IEEE Journal of Solid-State Circuits, vol. 3, No. 6, pp. 784-791, Jun. 1996.

Wong, Derek C., de Micheli, Giovanni, Flynn, Michael J., "Designing High-Performance Digital Circuits Using Wave Pipelining: Algorithms and Practical Experiences," IEEE Transactions on Computer-Aided Design of Integrated Circuits and Systems, vol. 12, No. 1, pp. 25-46, Jan. 1993.

U.S. Appl. No. 11/613,516, filed Dec. 20, 2006, titled "Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

U.S. Appl. No. 11/670,537, filed Feb. 2, 2007, titled "Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

U.S. Appl. No. 11/848,470, filed Aug. 31, 2007, titled "Design Structure for a Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

\* cited by examiner

DESIGN STRUCTURE FOR A FLEXIBLE MULTIMODE LOGIC ELEMENT FOR USE IN A CONFIGURABLE MIXED-LOGIC SIGNAL DISTRIBUTION PATH

FIELD OF THE DISCLOSURE

The present disclosure generally relates to the field of optimizing signal distribution paths in integrated circuits. In particular, the present disclosure is directed to a design structure for a method of controlling the performance of an integrated circuit path having a multi-mode circuit dynamically switchable among a plurality of operating modes.

BACKGROUND

Very high speed signals must be distributed across an integrated circuit (IC) chip and, with advances in semiconductor technology, the variation in the total delay of a digital signal path is becoming a larger and larger problem in submicron technologies. One approach to addressing this variability is to employ current-mode logic (CML) circuits for high speed signal distribution. CML is a CMOS analog logic family that works by diverting current from one path to another, rather than by switching transistors on and off. CML is characterized by very fast operating speeds and high power dissipation. In order to achieve the speed requirements of today's IC designs, large CML circuits that operate at very high power may be utilized. Alternatively, a signal distribution path may include a mix of high-power signal distribution blocks, such as CML circuits, and low-power signal distribution blocks, such as digital complementary metal-oxide semiconductor (CMOS) circuits. Digital CMOS is a MOS logic family that uses both p-type and n-type material for the channels and is characterized by having lower power consumption per gate.

It is favorable to transmit high speed signals while expending very low power. Because the fabrication process is widely variable it may be possible to operate at a certain desired frequency using a string of low-power signal distribution blocks, such as digital CMOS circuits, in the signal distribution path that is located in a fast IC chip (i.e., fast due to certain fabrication process conditions that result in certain circuit characteristics). By contrast, a slow IC chip (i.e., slow due to different fabrication process conditions that result in different circuit characteristics), the low-power signal distribution blocks may not be capable of transmitting the signal at the desired frequency. Because circuit designers are required to design for a certain performance under the worst possible semiconductor process conditions, they may be required to design entirely with high-power signal distribution blocks, which is inefficient and wasteful in an IC chip that is capable of transmitting high speed signals with low-power signal distribution blocks.

A need exists for a flexible multimode logic element that is suitable for use in a configurable mixed-logic signal distribution path, in order to provide a digital signal path that is programmable to include combinations of high-power and/or low-power signal distribution blocks, while maintaining a certain desired performance level.

SUMMARY OF THE DISCLOSURE

In one embodiment, the present disclosure is directed to a design structure embodied in a machine readable medium used in a design process for a method of controlling the performance of an integrated circuit path having a multi-mode circuit dynamically switchable among the following operating modes: a full-swing mode, a limited-swing mode, a full-swing to limited-swing converter mode, and a limited-swing to full-swing converter mode. The design structure of the method includes a means for determining a desired performance level of the integrated circuit path; and a means for dynamically switching the operating mode of the multi-mode circuit based on the desired performance level.

In another embodiment, the present disclosure is directed to a design structure embodied in a machine readable medium for performing a method of controlling a performance of an integrated circuit path having a plurality of multi-mode circuits, each of the plurality of multi-mode circuits being dynamically switchable among the following operating modes: a full-swing mode, a limited-swing mode, a full-swing to limited-swing converter mode, and a limited-swing to full-swing converter mode. The design structure of the method includes a means for determining a desired performance level of the integrated circuit path; a means for dynamically switching the operating mode of at least one of the plurality of multi-mode circuits based on the desired performance level; and a means for dynamically determining the optimal location in the integrated circuit path for setting an operating mode of one of the plurality of multi-mode circuits to a converter mode selected from the group consisting of a full-swing to limited-swing converter mode and a limited-swing to full-swing converter mode.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
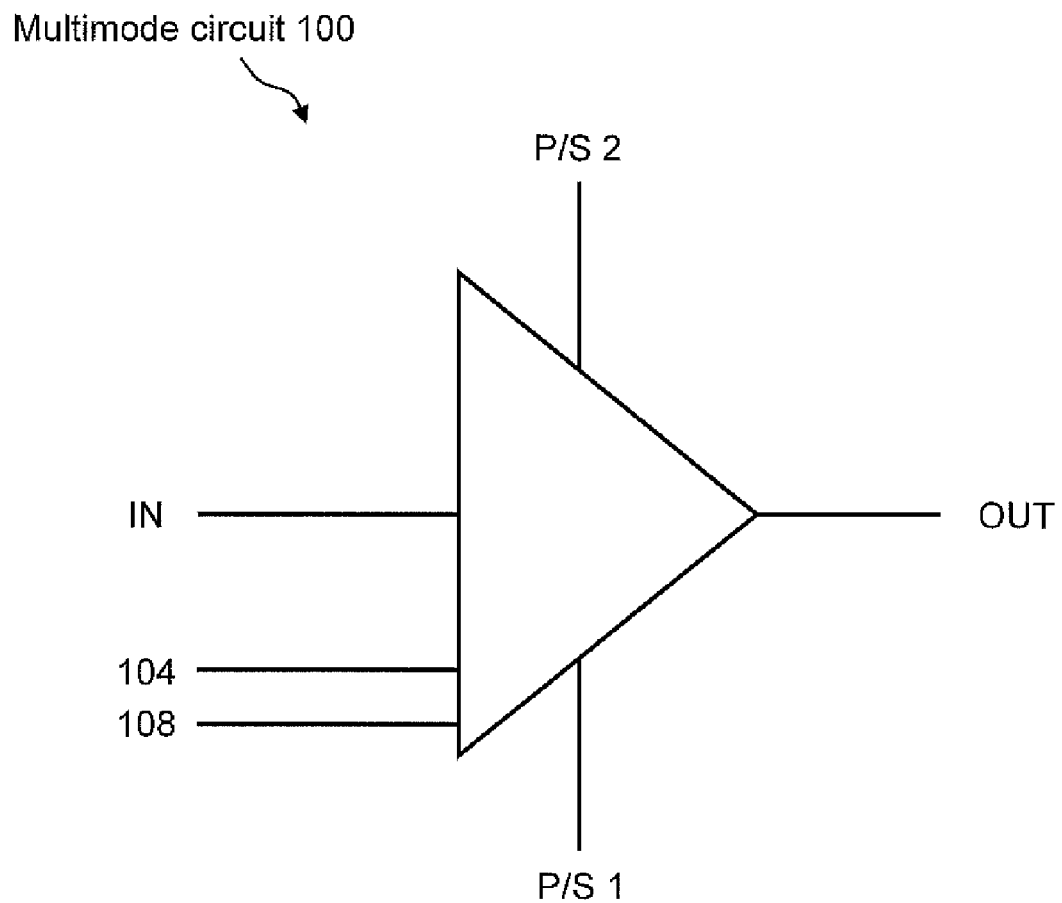
FIG. 1 illustrates a high level block diagram of one embodiment of a multimode circuit that is selectable to operate in one of multiple operating modes.

The present invention is directed to a design structure for a method of controlling the performance of an integrated circuit path having a multi-mode circuit dynamically switchable among a plurality of operating modes. FIG. 1 illustrates a high level block diagram of a multimode circuit 100 that is configured to allow dynamic selection of its operating mode to any one of multiple operating modes. In particular, multimode circuit 100 may be a multimode logic element (e.g., a multimode buffer circuit) that is capable of operating in one of multiple modes. In one example, the operating modes of multimode circuit 100 may be dynamically selectable in real time (e.g., during run time of a circuit in which multimode circuit 100 is installed, at the time of running a test on a circuit in which multimode circuit 100 is installed). One instance of multimode circuit 100 may operate in standalone or, alternatively, multiple instances of multimode circuit 100 may operate in combination with one another (e.g., in a distribution path). In one example embodiment, a dynamically selectable mode of operation of an example multimode circuit, such as multimode circuit 100, may allow for modification of distribution path characteristics after production of an integrated circuit that includes the distribution path. In another example embodiment, a dynamically selectable mode of operation of an example multimode circuit, such as multimode circuit 100, may allow for modification of the multimode circuit's operating mode at the time of manufacturing test. In one example, a mode of operation may be selected at the time of manufacturing test and fixed prior to normal operation of the circuit. In yet another example embodiment, a dynamically selectable mode of operation of an example multimode circuit, such as multimode circuit 100, may allow for optimization of power dissipation at given performance of an integrated circuit having the multimode circuit therein.

Multimode circuit 100 may include an input signal IN and an output signal OUT. Input signal IN may include a single input line or multiple input lines. In one example, input signal IN may include two full-swing complimentary input lines. In another example, input signal IN may include two differential complimentary input lines. Output signal OUT may include a single output line or multiple output lines. In one example, output line OUT may include two full-swing complimentary output lines. In another example, output line OUT may include two differential complimentary input lines. The distinction between "full-swing complimentary" signals and "differential complimentary" signals is set forth in detail below.

Multimode circuit 100 may also include one or more control bit inputs 104. One or more control bit inputs 104 may include any number of input lines required to provide instruction to multimode circuit 100 for setting an operating mode amongst the multiple possible operating modes of multimode circuit 100. Multimode circuit 100 may also include one or more adjustable bias voltage inputs 108. One or more adjustable bias voltage inputs 108 may provide an ability to tune an aspect (e.g., power) of multimode circuit 100. Example implantations for one or more adjustable bias voltage inputs 108 are described in more detail below.

Multimode circuit 100 may include electrical connections to one or more power supplies. For example, multimode circuit 100 is illustrated with a first power supply P/S 1 (e.g., a first power rail) and a second power supply P/S 2 (e.g., a second power rail). In one example, multimode circuit 100 may be interposed between first and second power supplies P/S 1 and P/S 2. The voltage of one or more power supplies (e.g., power supplies P/S 1 and P/S 2) may be any voltage as required by a particular application. In one example, power supply P/S 1 may be a ground voltage of about 0 volts. In another example, power supply P/S 2 may be at a core logic voltage (e.g., Vcc, Vdd). In yet another example, power supply P/S 2 may have a voltage more positive than that of power supply P/S 1 by an amount that is sufficient to ensure proper operation of a specific circuit.

The mode of operation of multimode circuit 100 may be set utilizing one or more input parameters, as is discussed in further detail herein. Example input parameters that may impact the mode of operation of multimode circuit 100 include, but are not limited to, one or more control bit inputs 104, input signal IN, one or more bias voltage inputs 108, and any combinations thereof. Example modes of operation for multimode circuit 100 include, but are not limited to, a full-swing mode, a limited-swing mode, a full-swing to limited-swing converter mode, and a limited-swing to full-swing converter mode. Table 110 of FIG. 1 illustrates states of input signal IN and output signal OUT for these four exemplary modes of operation.

One example operating mode is a full-swing mode. In a full-swing mode, multimode circuit 100 may operate such that input signal IN and output signal OUT have a "full" voltage swing in relation to the voltage potential between first power supply P/S 1 and second power supply P/S 2. In one embodiment, a multimode circuit (e.g., multimode circuit 100) set to operate in a full-swing mode may operate as a low power signal distribution block, such as a CMOS circuit. An example multimode circuit set to operate in full-swing mode is illustrated below with respect to FIGS. 3 and 4. In one aspect, a full swing may be characterized by a signal that is at about the voltage of a first power supply (e.g., Vdd), about the voltage of a second power supply (e.g., ground), or transitioning between these two values. In another aspect, a full voltage swing may be characterized by a signal having an electrical potential representing a binary "1" and an electrical potential representing a binary "0" with the "0" value represented by a voltage that is about the voltage of a first power supply (e.g., power supply P/S 1) and the "1" value represented by a voltage that is about the voltage of a second power supply (e.g., power supply P/S 2). In one example of a full swing, when first power supply P/S 1 is about 0 volts (ground) and second power supply P/S 2 is about 1.2 volts, the signal voltage swing of input signal IN and output signal OUT may be from about 0. volts to about 1.2 volts (i.e., CMOS levels), as shown in FIG. 4. A "full-swing complimentary" signal may be a pair of full swing signals in which one signal in the pair is at the "1" level whenever the other signal in the pair is at the "0" level.

Another example operating mode is a limited-swing mode. In a limited-swing mode, multimode circuit 100 may operate such that input signal IN and output signal OUT have a "limited" voltage swing in relation to the voltage potential between first power supply P/S 1 and second power supply P/S 2. In one embodiment, a multimode circuit (e.g., multimode circuit 100) set to operate in a limited-swing mode may operate as a high power signal distribution block, such as a CML circuit. An example multimode circuit set to operate in a limited-swing mode is illustrated below with respect to FIGS. 5 and 6. In one aspect, a limited voltage swing may be characterized by node voltages that switch in a region between a first power supply (e.g., Vdd) and a second power supply (e.g., ground), but never reach a voltage of the first power supply and/or a voltage of the second power supply. In another aspect, a limited voltage swing may be characterized by a signal having an electrical potential representing a binary "1" and an electrical potential representing a binary "0" with the "0" value represented by a voltage that is about the voltage of a first power supply (e.g., power supply P/S 1) minus some predetermined amount (e.g., "swing"), and the "1" value represented by a voltage that is about the voltage of a second power supply (e.g., power supply P/S 2). In one example of a limited swing, when first power supply P/S 1 is about 0 volts (ground) and second power supply P/S 2 is about 1.2 volts, the signal voltage swing of input signal IN and output signal OUT may be from about 0.6 volts to about 1.1 volts (i.e., CML levels), as shown in FIG. 6.

Yet another example operating mode is a full-swing to limited-swing converter mode. In a full-swing to limited-swing converter mode, multimode circuit 100 may operate as a signal distribution block that translates a full-swing input signal (e.g., full-swing CMOS levels) to a limited-swing output signal (e.g., low-swing CML levels). In one example, input signal IN may be fed by a low-power signal distribution block, such as a CMOS circuit, and output signal OUT output may drive a high-power signal distribution block, such as a CML circuit or additional multimode circuit. In one example, when first power supply P/S 1 is about 0 volts (ground) and second power supply P/S 2 is about 1.2 volts, the signal voltage swing of input signal IN may be from about 0 volts to about 1.2 volts (i.e., digital CMOS levels), and the signal voltage swing of output signal OUT may be from about 0.6 volts to about 1.1 volts (i.e., CML levels), as shown in FIG. 6.

Figure 9:
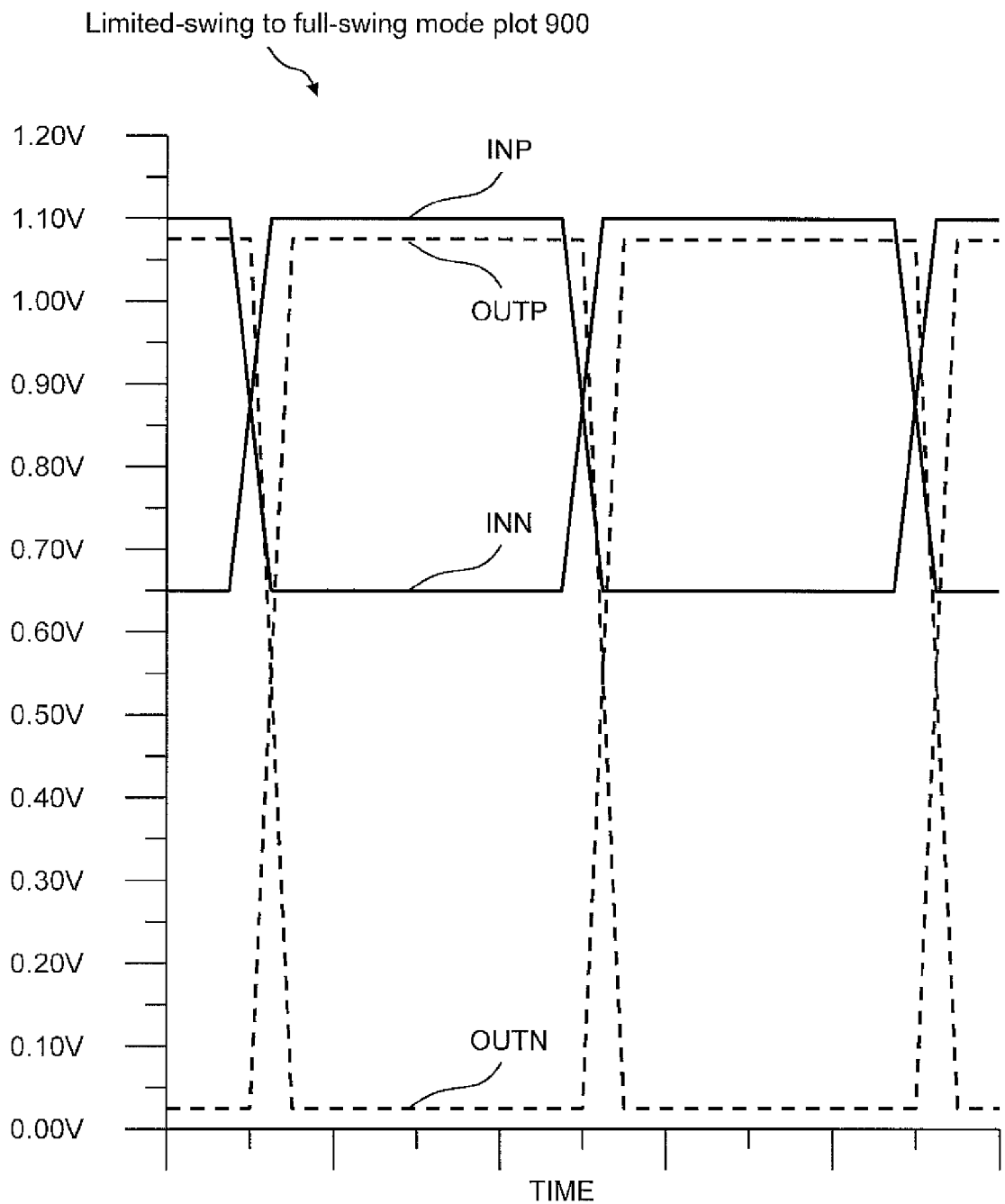
FIG. 9 illustrates an input/output signal plot of an example multimode circuit set to operate in a limited-swing to full-swing converter mode.

Still another example operating mode is a limited-swing to full-swing converter mode. In a limited-swing to full-swing converter mode, multimode circuit 100 may operate as a signal distribution block that translates a limited-swing input signal (e.g., low-swing CML levels) to a full-swing output signal (e.g., full-swing CMOS levels). In one example input signal IN may be fed by a high-power signal distribution block, such as a CML circuit, and output signal OUT may drive a low-power signal distribution block, such as a CMOS circuit. In one example, when first power supply P/S 1 is about 0 volts (ground) and second power supply P/S 2 is about 1.2 volts, the signal voltage swing of input signal IN may be from about 0.6 volts to about 1.1 volts (i.e., CML levels), and the signal voltage swing of output signal OUT may be from about 0 volts to about 1.2 volts (i.e., CMOS levels), as shown in FIG. 9.

Multimode circuit 100 of FIG. 1 has a single physical input port (e.g., input signal IN), which is a common input that is utilized by the circuitry of multimode circuit 100 regardless of its mode of operation. Likewise, multimode circuit 100 of FIG. 1 has a single physical output port (e.g., output signal OUT), which is a common output that is utilized regardless of its mode of operation. As discussed above and exemplified herein, input signal IN and output signal OUT may include any number of actual inputs that are shared by the circuitry of multimode circuit 100. The number of inputs (e.g., control bit input 104, bias voltage input 108, input signal IN) may be any number suitable to accomplish the dynamic selection of any one of a set or any one of a subset of operating modes, such as the above-mentioned operating modes.

Because of the flexibility that is provided by the multiple operating modes, multimode circuit 100 of FIG. 1 may be a flexible multimode logic element that is suitable for use in a selectable mixed-logic signal distribution path that is configured to be programmable to include combinations of high-power and/or low-power signal distribution blocks, depending on the IC operating conditions, while at the same time maintaining a certain desired performance level. Furthermore, in another embodiment, the use of a string of multimode circuits 100 in a signal distribution path or signal distribution tree may provide a method of optimizing chip power as a function of, for example, but not limited to, fabrication process variability, power supply variability, and/or temperature variability. One example circuit for forming a multimode circuit, such as multimode circuit 100, is described with reference to FIG. 2.

Figure 2:
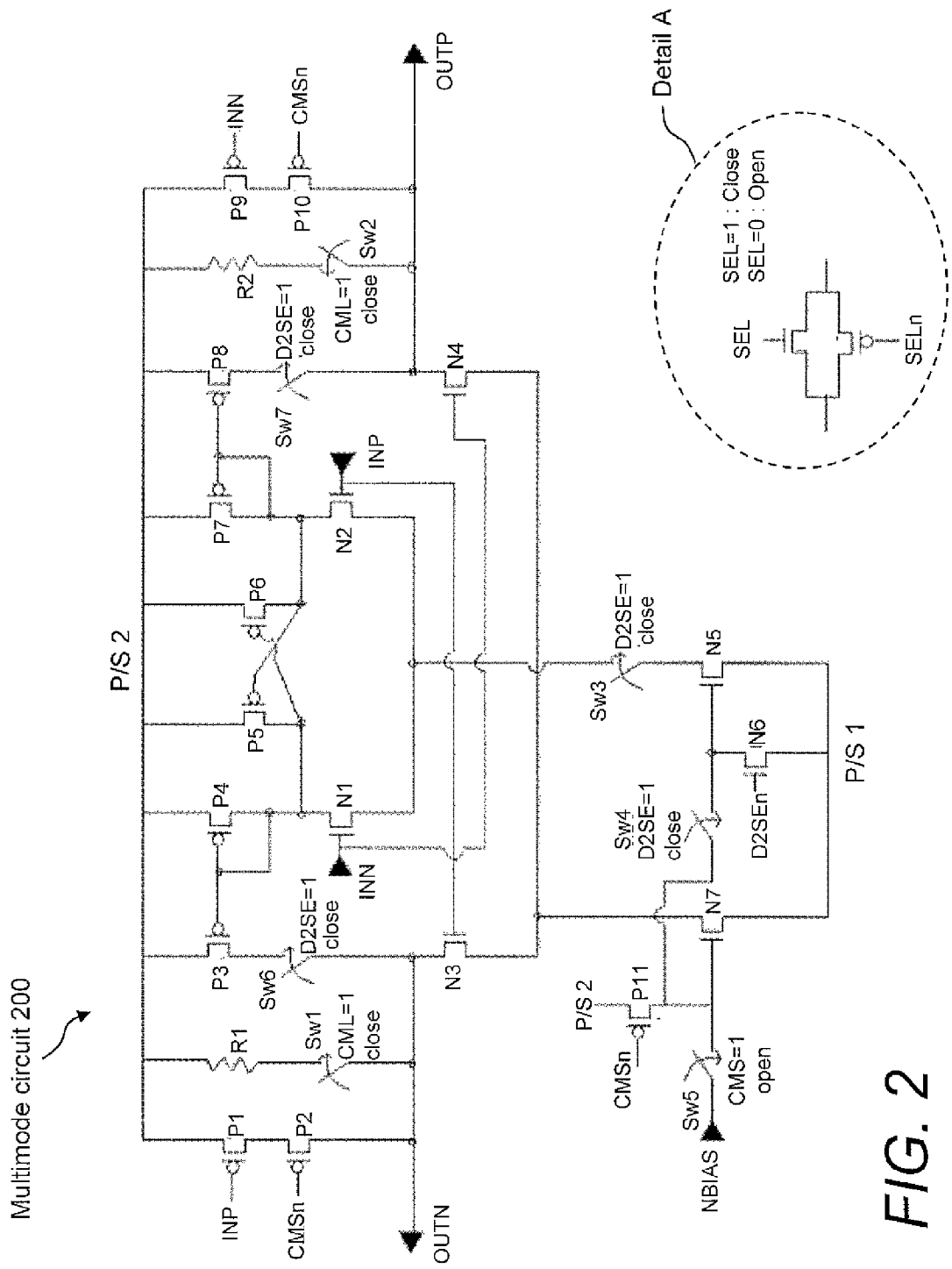
FIG. 2 illustrates a schematic diagram of another embodiment of a multimode circuit that is selectable to operate in one of multiple operating modes.

FIG. 2 illustrates a schematic diagram of a multimode circuit 200 that is configured to allow dynamic selection of its operating mode to any one of multiple operating modes. In particular, FIG. 2 shows that multimode circuit 200 includes an example arrangement of p-type and n-type transistors. More specifically, multimode circuit 200 may include a plurality of p-type field-effect transistors (PFETs), e.g., transistors P1 through P11, a plurality of n-type field-effect transistors (NFETs), e.g., transistors N1 through N7, and a plurality of electronic switches Sw1 through Sw7. Transistors P1 through P11, transistors N1 through N7, and switches Sw1 through Sw7 are electrically connected as shown in FIG. 2 to form a multimode differential buffer circuit. Certain components of multimode circuit 200 of FIG. 2 (such as transistor N3 and transistor N4) are utilized by more than one potential mode of the multimode circuit.

Multimode circuit 200 of FIG. 2 is not limited to the circuit arrangement that is shown in the schematic diagram of FIG. 2. Those skilled in the art will appreciate that the functions of multimode circuit 200 may be implemented using other arrangements of electronic components. In one example, all polarities within multimode circuit 200 may be inverted and, thus, all NFETS may become PFETS and all PFETS may become NFETS. In another example, one or more FETS may be replaced by another circuit element. Example circuit elements that may replace a FET include, but are not limited to, a resistor and a plurality of FETS in parallel. In yet another example, additional switches and/or paths may be added for additional functionality.

Multimode circuit 200 illustrates an example having input IN and output OUT of multimode circuit 100 of FIG. 1 implemented as an input signal pair INP/INN, which are complimentary differential inputs or complimentary full-swing inputs, and an output signal pair OUTP/OUTN, which are complimentary differential outputs, respectively. Multimode circuit 200 also includes a plurality of control bit inputs including first control signal CML and its compliment CMLn, a second control signal CMS and its compliment CMSn, and a third control signal D2SE and its compliment D2SEn. First power supply P/S 1 may be any voltage power supply (e.g., ground). Second power supply P/S 2 may be any voltage power supply (e.g., Vcc or Vdd). In one example, power supply P/S 1 has a voltage that is lower than the voltage of power supply P/S 2).

INP/INN. In one example, the values of any setting may change in real time operation of multimode circuit 200 and change the operating mode of multimode circuit 200.

Figure 3:
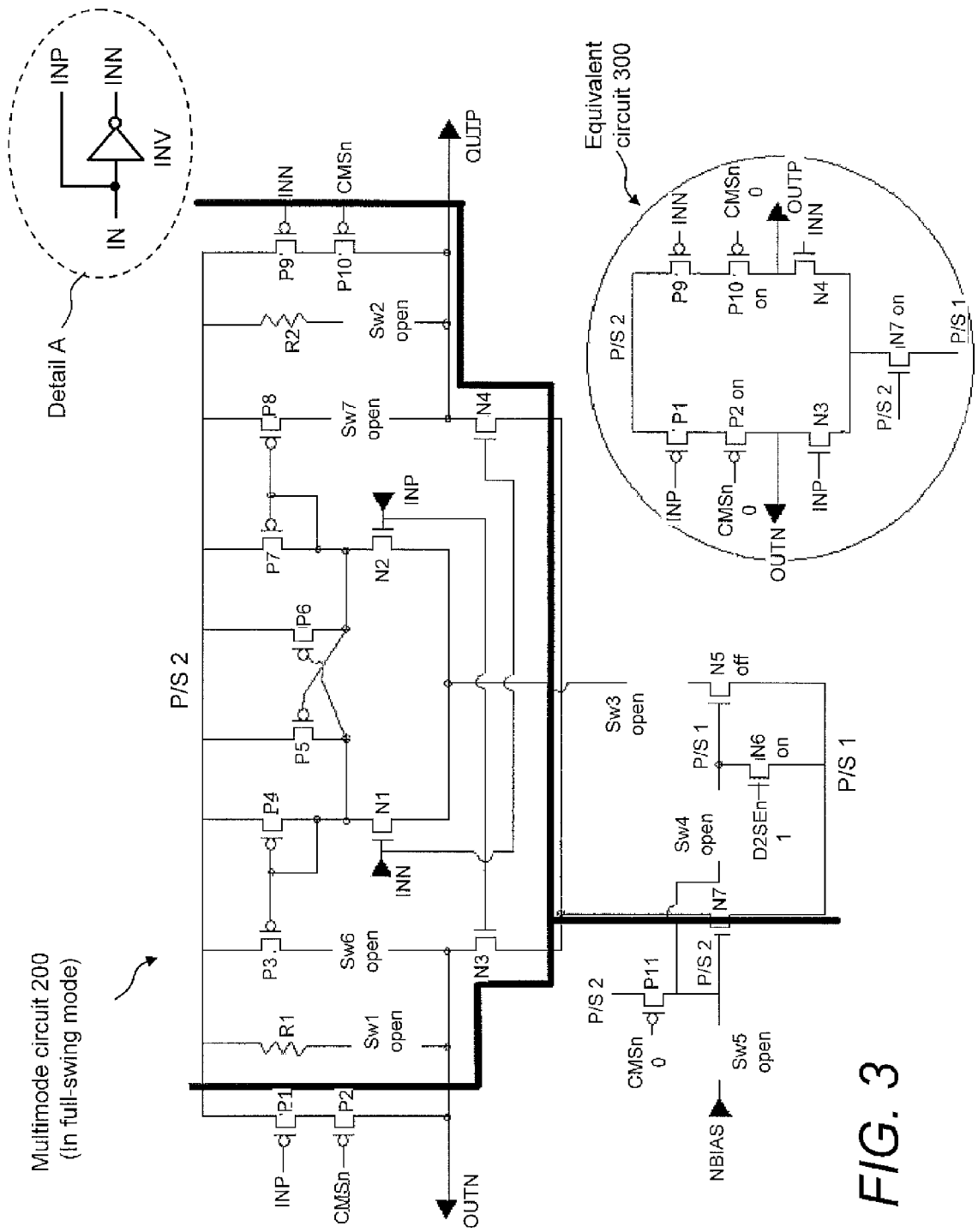
FIG. 3 illustrates a schematic diagram of an example multimode circuit set to operate in a full-swing mode.
Figure 4:
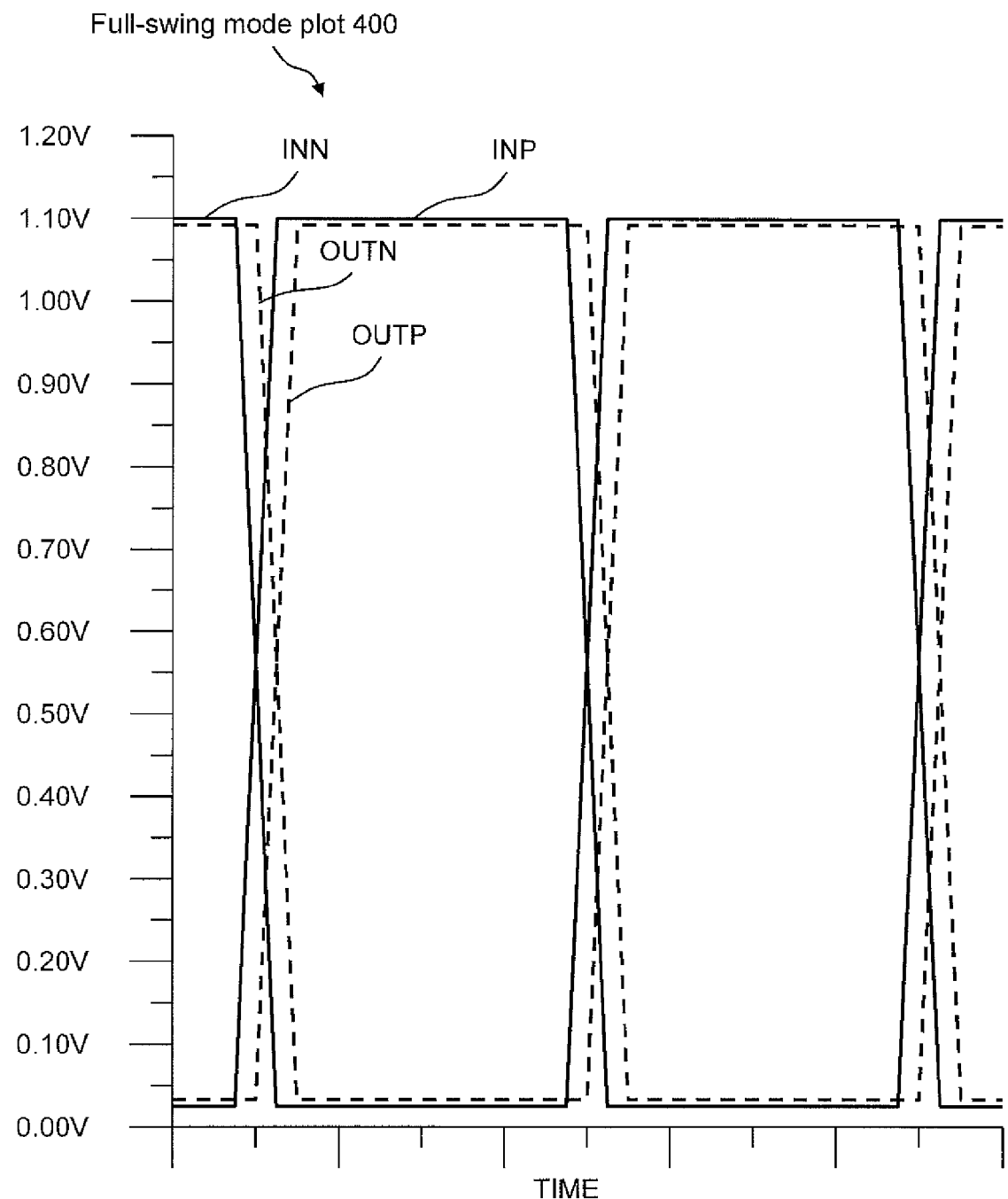
FIG. 4 illustrates an input/output signal plot of an example multimode circuit.

FIG. 3 illustrates an example schematic diagram of multimode circuit 200 of FIG. 2 that is set to operate in full-swing mode (as described in FIG. 1), in order to form, for example, a CMOS buffer circuit. Table 1 shows an example truth table for multimode circuit 200 when operating in full-swing mode. In particular, Table 1 shows an example setting of the control signals CML, D2SE, and CMS along with the states of all elements that are controlled directly by CML/D2SE, or CMS, as illustrated in FIG. 3.

TABLE 1

| Full-swing mode | | | | | | | | | | | |
|---|---|---|---|---|---|---|---|---|---|---|---|
| Controls | | | Elements that are controlled directly by CML/D2SE, and CMS | | | | | | | | |
| CML | D2SE | CMS | Sw1 | Sw2 | Sw3 | Sw4 | Sw5 | Sw6 | Sw7 | N6 | P11 |
| 0 | 0 | 1 | Open | Open | Open | Open | Open | Open | Open | on | on |

Any one or more of switches Sw1 through Sw7 may be implemented with any type of switching circuit elements. Examples of switching elements include, but are not limited to, a transmission gate pair (see Detail A), a body/gate controlled FET (e.g., a FinFET or other double gate FET), a triple well device with active body bias, a surface double gate device, and any combinations thereof. A Detail A of FIG. 2 shows one example electronic switch circuit that is suitable for use as each of switches Sw1 through Sw7. More specifically, Detail A shows an electronic switch that is implemented as a pair of transmission gates that are controlled via one of the full-swing complimentary control inputs (e.g., SEL and SELn) of multimode circuit 200, such as control signals CML/CMLn, control signals CMS/CMSn, and control signals D2SE/D2SEn.

In one example, switches Sw1 and Sw2 may be controlled via control signals CML/CMLn; switches Sw3, Sw4, Sw6, and Sw7 may be controlled via control signals D2SE/D2SEn; and switch Sw5 may be controlled via control signals CMS/CMSn control signal. In one example, when control signal CML=0: switches Sw1 and Sw2 are open and when control signal CML=1: switches Sw1 and Sw2 are closed; when control signal D2SE=0: switches Sw3, Sw4, Sw6, and Sw7 are open and when control signal D2SE=1: switches Sw3, Sw4, Sw6, and Sw7 are closed; and when control signal CMS=0: switch Sw5 is closed and when control signal CMS=1: switch Sw5 is open. As used herein, a control signal value of "1" represents a logical high value, which may not have an exact value of 1 volt in all systems. Also as used herein, a control signal value of "0" represents a logical low value, which may not have an exact value of 0 volts in all systems. Those of ordinary skill will understand variations in logical high and low values. Additionally, certain transistors may be controlled directly by use of control signals CML/CMLn, CMS/CMSn, and/or D2SE/D2SEn. In one example, transistor N6 may be controlled by control signal D2SEn and transistor P11 may be controlled by control signal CMSn.

Multimode circuit 200 may dynamically change its mode of operation based on a variety of setting including, but not limited to, control signals CML/CMLn, CMS/CMSn, and/or D2SE/D2SEn; the on/off states of transistors (e.g., transistors P1 through P11 and N1 through N7); the voltage level of NBIAS; and the voltage swing levels of signal input pair INP/INN. In one example, the values of any setting may change in real time operation of multimode circuit 200 and change the operating mode of multimode circuit 200.

Additionally, FIG. 3 shows an equivalent circuit 300, which represents a simplified version of multimode circuit 200 when operating in full-swing mode in order to form, for example, a CMOS buffer circuit. More specifically, equivalent circuit 300 shows the completed circuit paths of multimode circuit 200 when operating in full-swing mode and as a low-power signal distribution block. Multimode circuit 200 of FIG. 3 simplifies as an inverter i.e., OUTN=invert(INP), OUTP=invert(INN), and the outputs are full-swing complimentary (P/S 1-to-P/S 2). Referring again to multimode circuit 200 of FIG. 3, the limited-swing legs are turned off and transistor N7 is turned on to provide the ground path for the inverter. Opening switch Sw5 isolates the circuit from the NBIAS input. With transistor P11 turned on, the gate of transistor N7 is high, which turns on transistor N7 that serves as ground path to the inverter. Differential pair transistors N3 and N4 are used as the full-swing mode NFET legs.

FIG. 4 illustrates a full-swing mode plot 400, when P/S 1 is about 0 volts (ground) and P/S 2 is about 1.2 volts. In one example, a signal voltage swing of INP/INN of equivalent circuit 300 in FIG. 3 may be, for example, but not limited to, from about 0 volts to about 1.2 volts (i.e., CMOS levels) and the signal voltage swing of OUTP/OUTN of equivalent circuit 300 of FIG. 3 may likewise be, for example, but not limited to, from about 0 volts to about 1.2 volts. The signal inputs INN and INP may be complementary rail-to-rail (P/S 1-to-P/S 2) signals, as shown in FIG. 4. Alternatively, when a single rail-to-rail signal only is available, its complement may be created by use of a simple inverter, as shown in Detail A of FIG. 3. For example, a single-ended input signal IN feeds the input of an inverter INV as well as the INP input of multimode circuit 200. The output of INV provides the complement of IN, which is fed to the INN input of multimode circuit 200.

Figure 5:
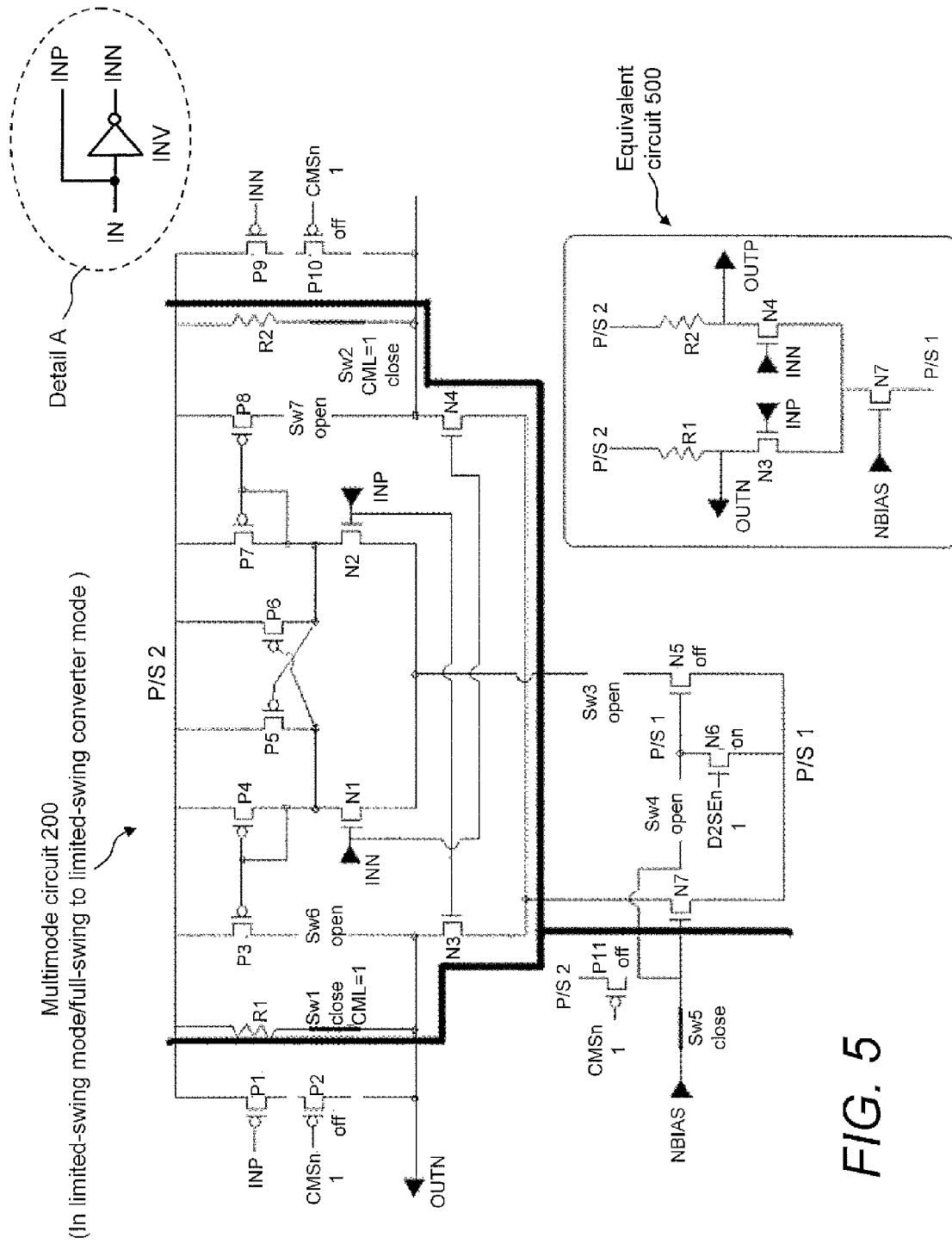
FIG. 5 illustrates a schematic diagram of an example multimode circuit set to operate in a limited-swing mode and/or a full-swing to limited-swing converter mode.
Figure 6:
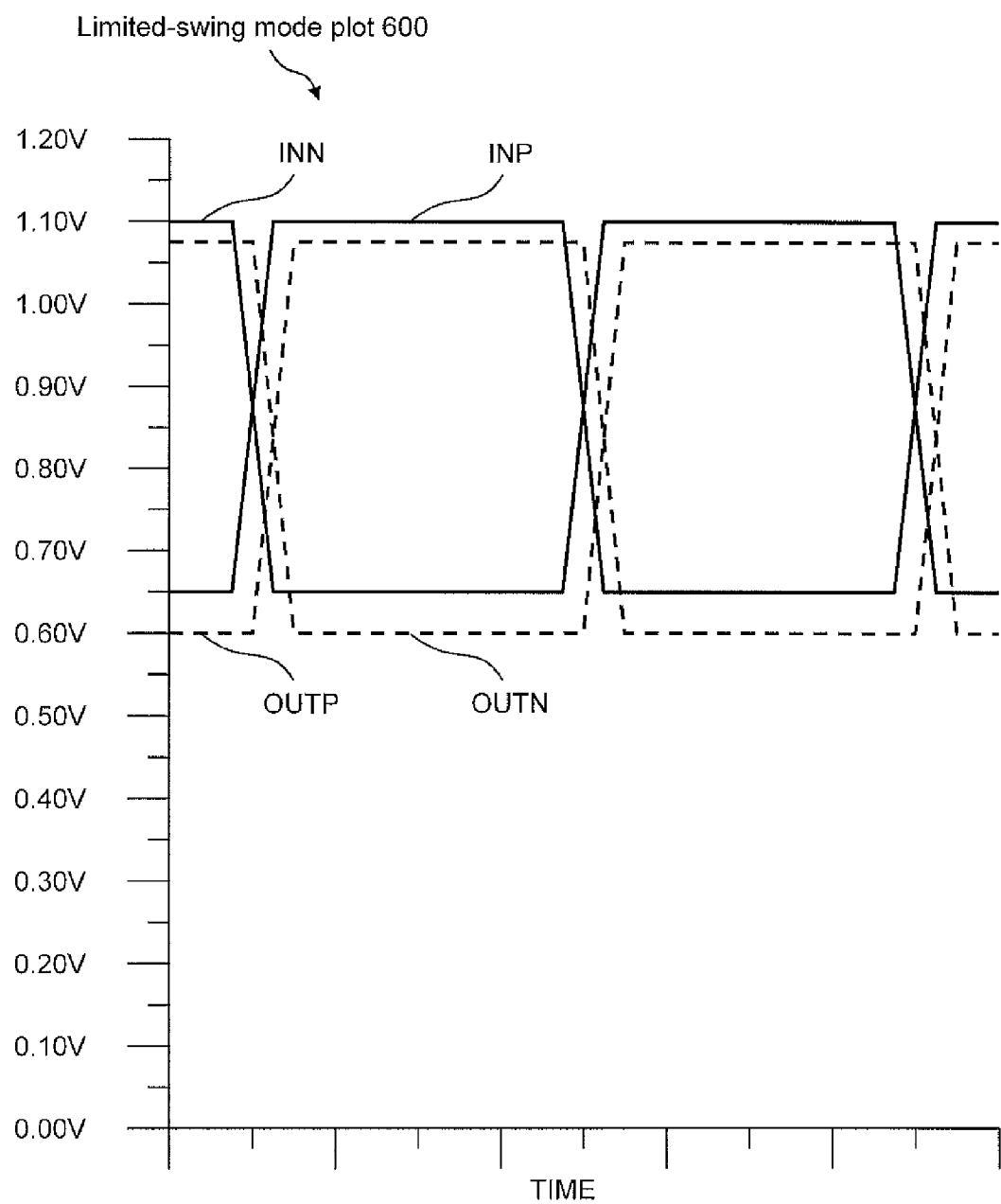
FIG. 6 illustrates an input/output signal plot of an example multimode circuit set to operate in a limited-swing mode.

FIG. 5 illustrates an example schematic diagram of multimode circuit 200 of FIG. 2 that is set to operate in limited-swing mode (as described in FIG. 1), in order to form, for example, a CML buffer circuit. Table 2 shows an example truth table for multimode circuit 200 when operating in limited-swing mode. In particular, Table 2 shows an example setting of the control signals CML, D2SE, and CMS along with the states of all elements that are controlled directly by CML/D2SE, or CMS, as illustrated in FIG. 3.

TABLE 2

Limited-swing mode

| Controls | | | Elements that are controlled directly by CML/D2SE, and CMS | | | | | | | | |
|---|---|---|---|---|---|---|---|---|---|---|---|
| CML | D2SE | CMS | Sw1 | Sw2 | Sw3 | Sw4 | Sw5 | Sw6 | Sw7 | N6 | P11 |
| 1 | 0 | 0 | Closed | Closed | Open | Open | Closed | Open | Open | on | off |

Additionally, FIG. 5 shows an equivalent circuit 500, which represents a simplified version of multimode circuit 200 when operating in limited-swing mode in order to form, for example, a CML buffer circuit. More specifically, equivalent circuit 500 shows the completed circuit paths of multimode circuit 200 when operating in limited-swing mode and as a high-power signal distribution block. Multimode circuit 200 of FIG. 5 simplifies as a differential circuit, as shown in equivalent circuit 500. Input signals INN and INP and output signals OUTN and OUTP are differential. NBIAS provides the bias voltage for transistor N7, which determines the current through transistor N7 (i.e., the tail bias current). In one example, NBIAS is set to a voltage of slightly greater than the threshold voltage of the transistor N7 (e.g., about 200 to about 300 mV). In another example, NBIAS is set to a voltage about 0.5 V more positive than power supply P/S 1. The speed of the differential circuit may be fine tuned as desired by adjusting NBIAS. Resistive loads R1 and R2 may be implemented as variable high precision resistors, a matrix of selectable resistors, or biased FETs such that the swing is tuned relative to the changing tail bias current. The value of resistive loads R1 and R2 may be, for example, but not limited to, in the range of about 50 Ohms to about 5 kOhms.

FIG. 6 illustrates a limited-swing mode plot 600, when P/S 1 is about 0 volts (ground) and P/S 2 is about 1.2 volts. In one example, a signal voltage swing of INP/INN of equivalent circuit 500 of FIG. 5 may be, for example, but not limited to, from about 0.6 volts to about 1.2 volts (i.e., CML levels) and the signal voltage swing of OUTP/OUTN of equivalent circuit 500 may likewise be, for example, but not limited to, from about 0.6 volts to about 1.2 volts.

Figure 7:
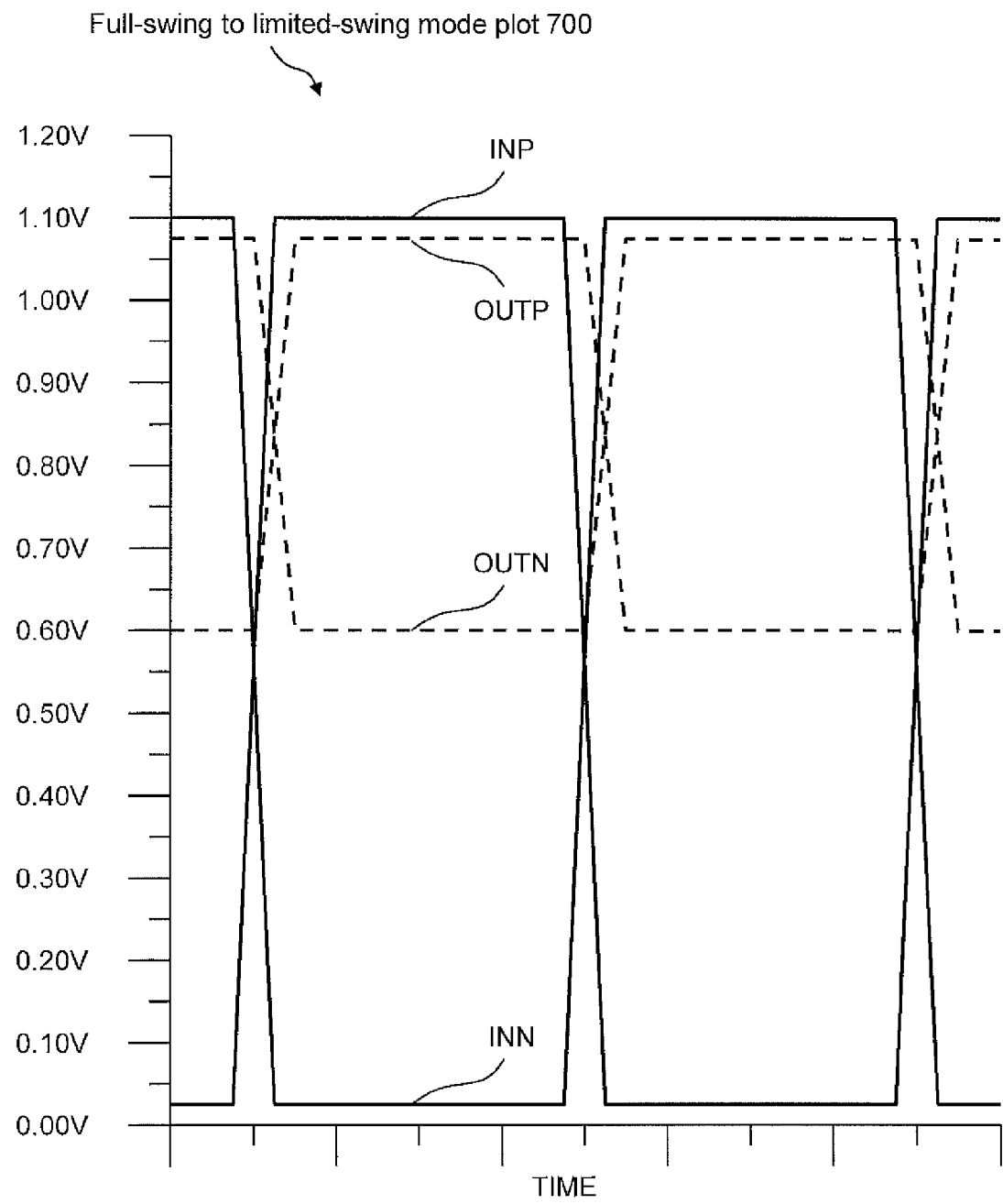
FIG. 7 illustrates an input/output signal plot of an example multimode circuit set to operate in a full-swing to limited-swing converter mode, as shown in FIG. 5.

FIG. 5 also illustrates an example schematic diagram of multimode circuit 200 of FIG. 2 that is set to operate in full-swing to limited-swing converter mode (as described in FIG. 1), in order to form a converter circuit that translates, for example, full-swing CMOS levels to low-swing CML levels. Table 3 shows an example truth table for multimode circuit 200 when operating in full-swing to limited-swing converter mode in order to form a converter circuit that translates, for example, full-swing CMOS levels to low-swing CML levels. In particular, Table 3 shows an example setting of the control signals CML, D2SE, and CMS along with the states of all elements that are controlled directly by CML/D2SE, or CMS, which is illustrated in FIG. 5. Note that the settings of the control inputs CML, D2SE, and CMS is identical to the settings of limited-swing mode, as shown in Table 2. Consequently, equivalent circuit 500 of FIG. 5 illustrates multimode circuit 200 when operating in ether limited-swing mode or full-swing to limited-swing converter mode. Therefore, full-swing to limited-swing converter mode is substantially identical to limited-swing mode except for the voltage swing of input signals INP and INN, as shown in FIG. 7. In doing so, equivalent circuit 500 of FIG. 5 may function as a low-power to high-power conversion block.

TABLE 3

Full-swing to limited-swing converter mode

| Controls | | | Elements that are controlled directly by CML/D2SE, and CMS | | | | | | | | |
|---|---|---|---|---|---|---|---|---|---|---|---|
| CML | D2SE | CMS | Sw1 | Sw2 | Sw3 | Sw4 | Sw5 | Sw6 | Sw7 | N6 | P11 |
| 1 | 0 | 0 | Closed | Closed | Open | Open | Closed | Open | Open | on | off |

FIG. 7 illustrates a full-swing to limited-swing converter mode plot 700, when P/S 1 is about 0 volts (ground) and P/S 2 is about 1.2 volts. In one example, a signal voltage swing of INP/INN of equivalent circuit 500 of FIG. 5 may be, for example, but not limited to, from about 0 volts to about 1.2 volts (i.e., CMOS levels), while the signal voltage swing of OUTP/OUTN of equivalent circuit 500 may be, for example, but not limited to, from about 0.6 volts to about 1.1 volts (i.e., CML levels). The signal inputs INN and INP may be complementary rail-to-rail (P/S 1-to-P/S 2) signals, as shown in FIG. 7. Alternatively, when a single rail-to-rail signal only is available, its complement may be created by use of a simple inverter, as shown in Detail A of FIG. 5. For example, a single-ended input signal IN feeds the input of an inverter INV as well as the INP input of multimode circuit 200. The output of INV provides the complement of IN, which is fed to the INN input of multimode circuit 200. In another example, multimode circuit 200 may be modified to allow the arrival time of the true and generated compliment versions of the input arrive at the differential pair of the multimode circuit at substantially the same time.

Figure 8:
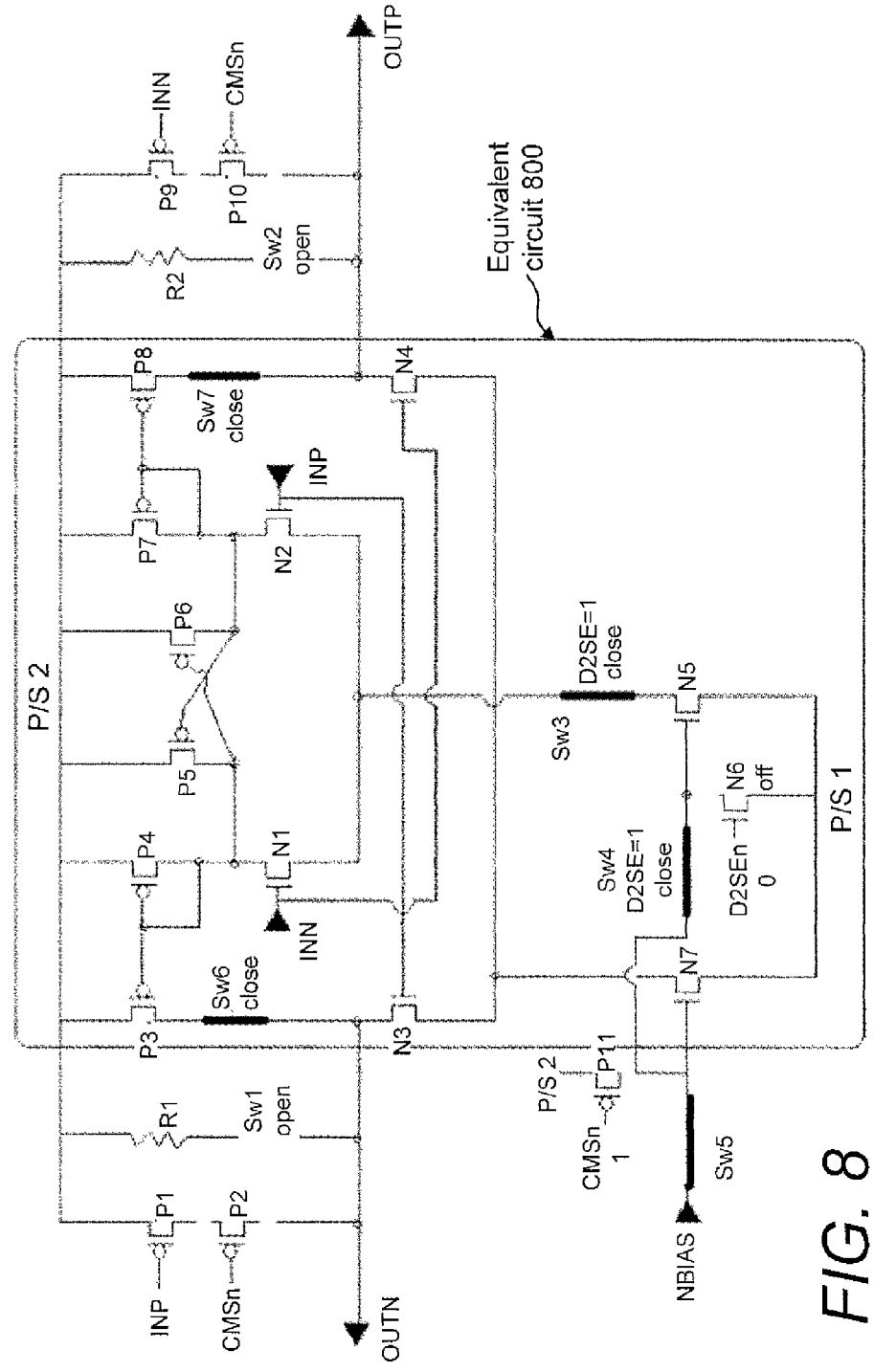
FIG. 8 illustrates a schematic diagram of an example multimode circuit set to operate in a limited-swing to full-swing converter mode.

FIG. 8 illustrates an example schematic diagram of multimode circuit 200 of FIG. 2 that is set to operate in limited-swing to full-swing converter mode (as described in FIG. 1), in order to form a converter circuit that translates, for example, low-swing CML levels to full-swing CMOS levels. Table 4 shows an example truth table for multimode circuit 200 when operating in limited-swing to full-swing converter mode. In particular, Table 4 shows an example setting of the control signals CML, D2SE, and CMS along with the states of all elements that are controlled directly by CML/D2SE, or CMS, as illustrated in FIG. 3.

TABLE 4

Limited-swing to full-swing converter mode

| Controls | | | Elements that are controlled directly by CML/D2SE, and CMS | | | | | | | | |
|---|---|---|---|---|---|---|---|---|---|---|---|
| CML | D2SE | CMS | Sw1 | Sw2 | Sw3 | Sw4 | Sw5 | Sw6 | Sw7 | N6 | P11 |
| 0 | 1 | 0 | Open | Open | Closed | Closed | Closed | Closed | Closed | off | off |

Additionally, FIG. 8 shows an equivalent circuit 800, which represents a simplified version of multimode circuit 100 when operating in limited-swing to full-swing converter mode. More specifically, equivalent circuit 800 shows the completed circuit paths of multimode circuit 100 when operating in limited-swing to full-swing converter mode and as a high-power to low-power conversion block. Equivalent circuit 800 of FIG. 8 shows a typical dual-N differential pair circuit that has cross-coupled self-biasing PFETS. The current from transistor N1 of one differential pair is mirrored into transistor N3 of another differential pair. Similarly, the current from transistor N2 of one differential pair is mirrored into transistor N4 of another differential pair. Again, NBIAS provides the bias voltage for transistor N7, which determines the current through transistor N7 (i.e., the tail bias current). In one example, NBIAS is set to a voltage of slightly greater than the threshold voltage of the transistor N7 (e.g., about 200 to about 300 mV). In another example, NBIAS is set to a voltage about 0.5 V more positive than power supply P/S 1.

FIG. 9 illustrates a limited-swing to full-swing converter mode plot 800, when P/S 1 is about 0 volts (ground) and P/S 2 is about 1.2 volts. In one example, a signal voltage swing of INP/INN of equivalent circuit 800 of FIG. 8 may be, for example, but not limited to, from about 0.6 volts to about 1.1 volts (i.e., CML levels), while the signal voltage swing of OUTP/OUTN of equivalent circuit 700 may be, for example, but not limited to, from about 0.05 volts to about 1.1 volts (i.e., CMOS levels).

Figure 10:
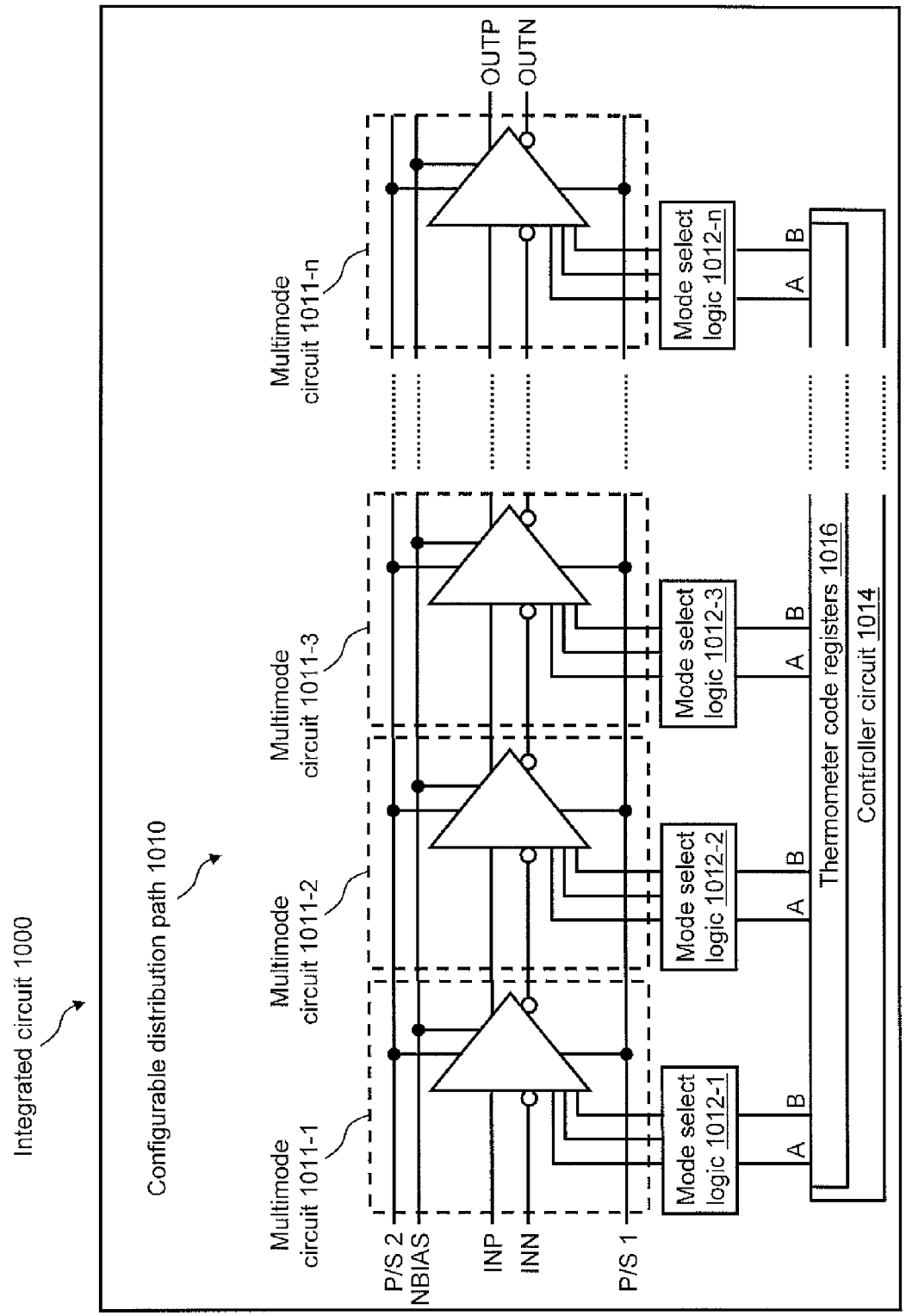
FIG. 10 illustrates a high level block diagram of one embodiment of an integrated circuit that includes an example configurable distribution path that is formed of a string of exemplary multimode circuits.

FIG. 10 illustrates a high level block diagram of an integrated circuit 1000 that includes a configurable distribution path 1010 that is formed of a string of any number of one or more multimode circuits 1011, each including a multimode circuit, such as multimode circuit 100 of FIG. 1 and with an example embodiment being multimode circuit 200 of FIG. 2, and each of which may be configured to be set dynamically to operate in one of multiple modes. Configurable distribution path 1010 may include any number of multimode circuits 1011, such as multimode circuits 1011-1, 1011-2, 1011-3, through 1011-n, that may be electrically connected (e.g., in series) as shown in FIG. 10. Signal inputs INP/INN of multimode circuit 1011-1 of configurable distribution path 1010 may be driven by any standard logic element that is compatible with an expected limited-swing or full-swing input signals, depending on the selected mode of operation of multimode circuit 1011-1. Similarly, output signals OUTP/OUTN of multimode circuit 1011-n may drive any standard logic element that is compatible with its limited-swing or full-swing output signals, depending on the selected mode of operation of multimode circuit 1011-n.

Additionally, each multimode circuit 1011 of configurable distribution path 1010 may have an associated mode select logic 1012. For example, mode select logic 1012-1, 1012-2, 1012-3 through 1012-n are associated with multimode circuits 1011-1, 1011-2, 1011-3, through 1011-n, respectively. Each mode select logic 1012 may be the decode logic for translating a control input. In one example, the control input includes 2-bits of data (e.g., a SEL A and SEL B) that are decoded in order to provide the control signals CML, D2SE, and CMS. More details of one example of a mode select logic, such as mode select logic 1012, are found with reference to FIG. 11.

An integrated circuit, such as integrated circuit 1000, is not limited to one configurable distribution path only, such as one configurable distribution path 1010 only; rather, an integrated circuit may include multiple configurable distribution paths, each of which may include one or more multimode circuits, such as one or more multimode circuits 100 of FIG. 1. Additionally, each configurable distribution path within an integrated circuit, such as configurable distribution path 1010 of FIG. 10, may be a standalone signal distribution path, one portion only of a larger distribution path, and/or one of multiple branches of a signal distribution tree. In particular, a signal distribution path or signal distribution tree may be formed of any arrangement of one or more configurable distribution paths, such as one or more configurable distribution paths 1010 of FIG. 10.

Each mode select logic 1012 block has a set of unique select inputs, such as SEL A and SEL B inputs, all of which are independently controlled via a controller circuit 1014 that may include one or more thermometer code registers 1016 for generating the SEL A and SEL B inputs of all mode select logic 1012-1, 1012-2, 1012-3 through 1012-n blocks. Alternatively, any number of select bits may be utilized for control of each multimode circuit 1011. A thermometer code register is an up/down shift register that contains a contiguous string of one or more ones with a single transition to a contiguous string of one or more zeros or visa versa and, wherein, the transition point may be shifted up or down. More details of example outputs of one or more thermometer code registers 1016 are found with reference to FIG. 12.

Controller circuit 1014 may be any combinational logic, state machine or processor device that is capable of determining the optimal position of any change-over between full-swing or limited-swing modes, which involves a trade-off between the overall delay of a distribution network, such as configurable distribution path 1010, and its power dissipation. Subsequently, controller circuit 1014 sets the states of all SEL A and SEL B inputs of all mode select logic 1012 blocks. Alternatively, controller circuit 1014 may generate directly the control signals CML, D2SE, and CMS for multimode circuits 1011-1, 1011-2, 1011-3, through 1011-n, without the use of mode select logic 1012-1, 1012-2, 1012-3 through 1012-n. Alternatively, mode select logic 1012, controller circuit 1014, and thermometer code registers 1016, may be replaced with any circuitry that provides one or more control bits to multimode circuits 1011 in order to allow each multimode circuit 1011 to dynamically change mode. More details of an example controller circuit are found with reference to FIG. 13.

With continuing reference to FIG. 10, the operation of configurable distribution path 1010 is as follows. Each multimode circuit 1011 along the path of configurable distribution path 1010 may be set to one of multiple operating modes depending on a desired performance for a certain set of operating conditions under the control of controller circuit 1014. For example, for "slow" operating conditions of the IC and/or environmental condition, it may be beneficial to set all of multimode circuits 1011-1, 1011-2, 1011-3, through 1011-*n* of configurable distribution path 1010 to limited-swing mode, which is the highest speed mode of operation and also consumes the most amount of power as compared to full-swing mode. Alternatively, for "fast" operating conditions of the IC and/or environmental conditions, it may be beneficial to set all of multimode circuits 1011-1, 1011-2, 1011-3, through 1011-*n* of configurable distribution path 1010 to full-swing mode, which is the lowest speed mode of operation and also consumes the least amount of power as compared to limited-swing mode. Alternatively, configurable distribution path 1010 may include a combination of a certain number of multimode circuits 100 that are set to limited-swing mode and a certain number of multimode circuits 1011 that are set to full-swing mode. In this case, a multimode circuit 1011 that is set to limited-swing to full-swing converter mode may be connected between an upstream multimode circuit 1011 that is set to limited-swing mode (or a fixed limited-swing circuit) and a downstream multimode circuit 1011 that is set to full-swing mode (or a fixed full-swing circuit). By contrast, a multimode circuit 1011 that is set to full-swing to limited-swing converter mode may be connected between an upstream multimode circuit 1011 that is set to full-swing mode (or a fixed full-swing circuit) and a downstream multimode circuit 1011 that is set to limited-swing mode (or a fixed limited-swing circuit). Any number of translations from limited-swing signals (e.g., low-swing CML levels) to full-swing converter signals (e.g., full-swing CMOS levels) and/or full-swing signals to limited-swing signals may occur along configurable distribution path 1010 depending on certain arrangements of multimode circuits 1011 that are set to limited-swing mode and multimode circuits 1011 that are set to full-swing mode. Details of one example arrangement of multimode circuits 1011 along a configurable distribution path are found with reference to FIG. 12.

Figure 11:
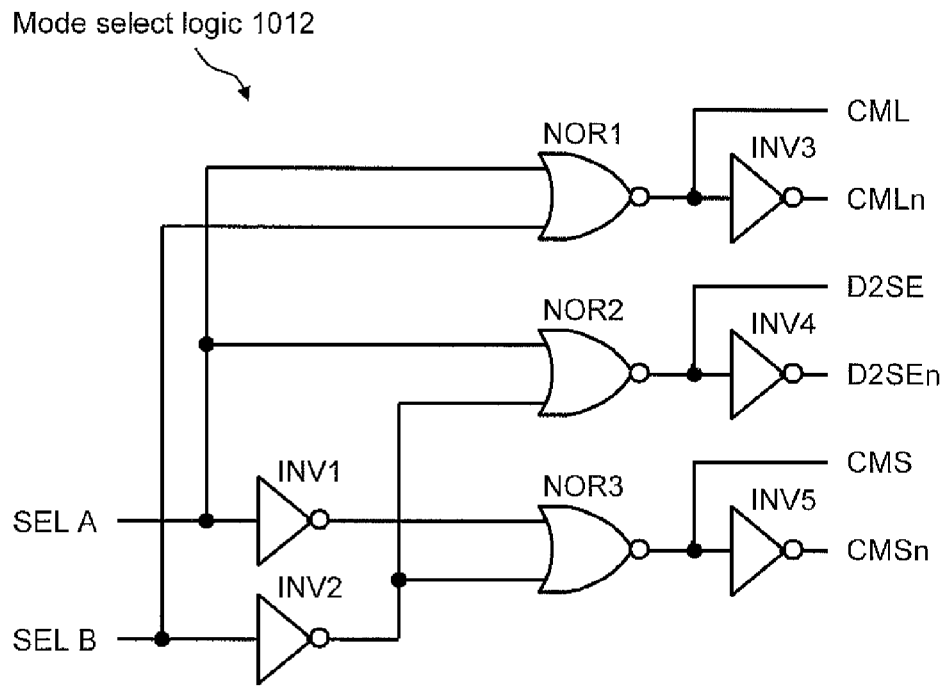
FIG. 11 illustrates a schematic diagram of one example instance of a mode select logic that is suitable for use with a multimode circuit.

FIG. 11 illustrates a schematic diagram of one example instance of mode select logic, such as mode select logic 1012 of FIG. 10, that is suitable for use with a multimode circuit, each of which may include a multimode circuit such as multimode circuit 100 of FIG. 1 and with an example embodiment being multimode circuit 200 of FIG. 2. In the example of FIG. 11, a 2-bit data input, SEL A and SEL B, are decoded in order to produce up to four unique states of control signals, such as four unique states of control signals CML, D2SE, and CMS, for uniquely setting the operating mode of a multimode circuit, such as multimode circuit 100. In the example of FIG. 11, mode select logic 1012 may include a first inverter INV1, a second inverter INV2, a first NOR gate NOR1 that feeds a third inverter INV3, a second NOR gate NOR2 that feeds a fourth inverter INV4, and a third NOR gate NOR3 that feeds a fifth inverter INV5. In this example, INV1, INV2, NOR1, NOR2, NOR3, INV3, INV4, and INV5 are electrically connected as shown in FIG. 11 in order to generate control signals CML/CMLn, D2SE/D2SEn, and CMS/CMSn from the SEL A and SEL B inputs according to Table 5 below.

TABLE 5

Example truth table for SEL A and B decode

| Mode of operation | Selects | | Controls | | |
|---|---|---|---|---|---|
| | SEL A | SEL B | CML | D2SE | CMS |
| Full-swing mode | 1 | 1 | 0 | 0 | 1 |
| Limited-swing mode or Full-swing to limited-swing converter mode | 0 | 0 | 1 | 0 | 0 |
| Limited-swing to full-swing converter mode | 0 | 1 | 0 | 1 | 0 |
| (Don't care) | 1 | 0 | 0 | 0 | 0 |

Figure 12:
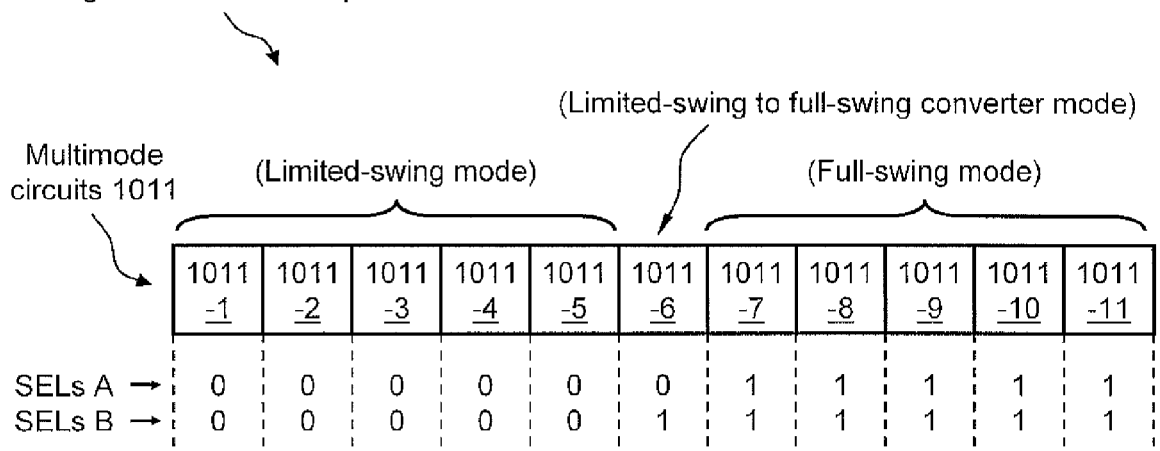
FIG. 12 illustrates a high level block diagram of an example of a configurable distribution path that is formed of a string of exemplary multimode circuits.

FIG. 12 illustrates a high level block diagram of one example configurable distribution path 1200 that is formed of a string of any number of one or more multimode circuits 1011 that are shown in FIG. 10, each of which may include a multimode circuit such as multimode circuit 100 of FIG. 1 and with an example embodiment being multimode circuit 200 of FIG. 2. In this example, configurable distribution path 1200 includes multimode circuits 1011-1 through 1011-11. More specifically, multimode circuits 1011-1 through 1011-5 are set to limited-swing mode and multimode circuits 1011-7 through 1011-11 are set to full-swing mode. Additionally, multimode circuit 1011-6 is set to limited-swing to full-swing converter mode in order to provide the signal translation between upstream multimode circuit 1011-5, which is supplying, for example, low-swing CML levels, and downstream multimode circuit 1011-7, which is expecting, for example, full-swing CMOS levels. In this example, SEL A=0 and SEL B=0 for multimode circuits 1011-1 through 1011-5, SEL A=0 and SEL B=1 for multimode circuit 1011-6, and SEL A=1 and SEL B=1 for multimode circuits 1011-7 through 1011-11.

Referring again to FIG. 12, the contents of a first and a second thermometer code register 1016 of FIG. 10 are offset by one position. In one example, the first instance of a thermometer code register 1016 generates a string of SELs A, such as 00000011111, for multimode circuits 1011-1 through 1011-11 and the second instance of a thermometer code register 1016 generates a string of SELs B, such as 00000111111, for multimode circuits 1011-1 through 1011-11. The location of the multimode circuit 1011 that is set to limited-swing to full-swing converter mode may be adjusted along the string of multimode circuits 1011 by shifting the contents of the thermometer code registers either toward multimode circuit 1011-1 or toward multimode circuit 1011-11 as desired. In particular, shifting the contents of the thermometer code registers toward multimode circuit 1011-1 will slow the path by increasing the number of multimode circuits 1011 that are set to full-swing mode and decreasing the number of multimode circuits 1011 that are set to limited-swing mode. By contrast, shifting the contents of the thermometer code registers toward multimode circuit 1011-11 will speed up the path by increasing the number of multimode circuits 1011 that are set to limited-swing mode and decreasing the number of multimode circuits 1011 that are set to full-swing mode. In doing so, the performance of configurable distribution path 1200 may be adjusted in real time (i.e., not at fabrication process time) in order to optimize configurable distribution path 1200 for a desired performance level in a certain operating condition. Note that when the registers are shifted they are filled with 1's from the full-swing side and 0's from the limited-swing side. In another embodiment, a dual shift register may be replaced with a single shift register where the connection point for SEL A and SEL B of any control circuit/ multimode buffer are offset by a single position.

Figure 13:
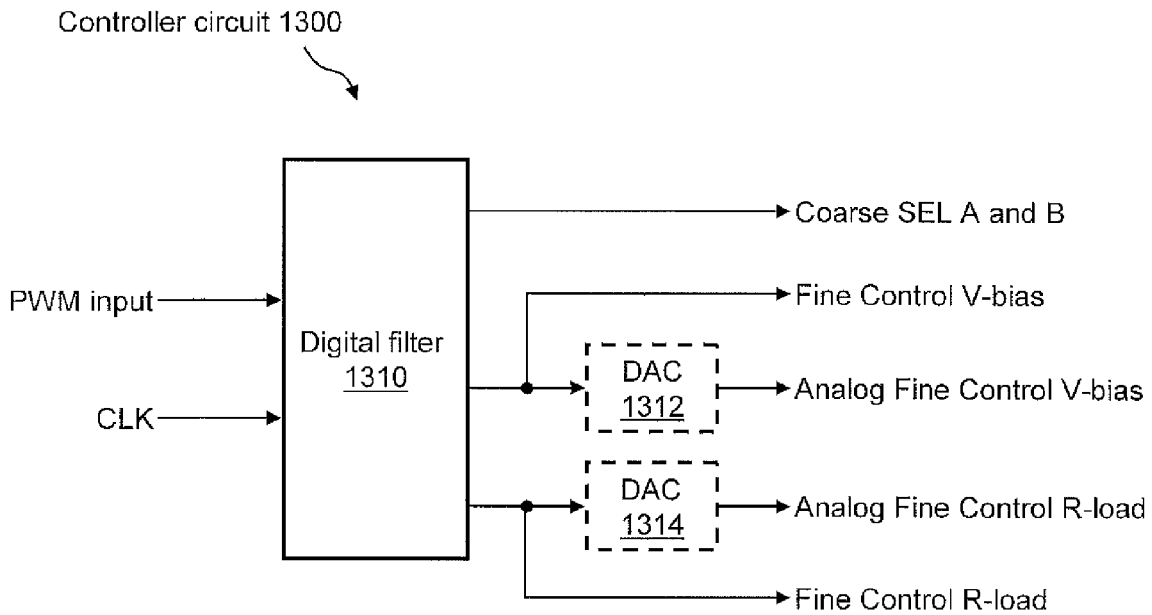
FIG. 13 illustrates a high level block diagram of an example of a controller circuit that is suitable for use with a configurable distribution path that is formed of a string of exemplary multimode circuits.

FIG. 13 illustrates a high level block diagram of an example controller circuit 1300 that is suitable for use with a configurable distribution path that is formed of a string of multimode circuits of FIG. 2. Controller circuit 1300 may include a digital filter 1310 that is fed by a pulse-width modulation (PWM) input signal and a clock (CLK) input signal. Digital filter 1310 may generate a set of coarse select pairs, such as a coarse SEL A and SEL B pair, for each multimode circuit of a certain configurable distribution path, such as multimode circuits 1011 of configurable distribution path 1010 of FIG. 10. Additionally, digital filter 1310 may generate a set of digital fine control signals, such as fine control V-bias signals and fine control R-load signals, for each multimode circuit of a certain configurable distribution path. Optionally, controller circuit 1300 may include a digital-to-analog converter (DAC) 1312 and a DAC 1314 at the output of digital filter 1310, in order to generate a set of analog fine control signals, such as analog fine control V-bias signals and analog fine control R-load signals, for each multimode circuit of a certain configurable distribution path. DAC 1312 and DAC 1314 are standard DAC devices of any designer-defined resolution. As a result, the fine control bus signals may be delivered directly in thermometer code format, or, alternatively, may be converted to analog format by the optional DAC 1312 and DAC 1314.

Controller circuit 1300 may operate as a digital filter. In its simplest mode, controller circuit 1300 accumulates the values of the bits presented at its PWM input and when a predetermined threshold is reached controller circuit 1300 shifts the SEL A and SEL B control buses one way or the other by one position. The control buses may be initialized in order to set the limited-swing to full-swing "converter" mode multimode circuit in any position along the bus. In one example, the control buses are initialized in order to set the converter mode multimode circuit in the center of the distribution path, such as the center (e.g., at 1010 n/2) of configurable distribution path 1010 of FIG. 10. In one example, this assumption may be included in the overall timing of the distribution at design/synthesis time. The coarse SEL A and SEL B control buses may be used for coarse delay control. Controller circuit 1300 may also generate the fine control bus in thermometer code format. This fine control bus may be initialized so that the transition from zeros to ones occurs in any position along the bus. In one example, the fine control bus may be initialized so that the transition from zeros to ones occurs in the center of the bus. In this way, once the SEL A and SEL B bus states have been determined to be optimum, a fine adjust procedure, similar to whatever procedure is used to set the SEL A/B transition point, may be used in order to tune the delay/power yet further. This may be used by one or more of the limited-swing mode multimode circuits 100 of FIG. 1 in order to tune their power to the minimum required in order to meet the overall distribution delay criteria that is set by an optimization technique, such as the optimization circuits of FIGS. 14, 15, 16, 17, and 18. The thermometer code may be well-suited to power adjustments of limited-swing mode multimode circuits, as the power adjustment involves switching in and out parallel fingers of both current mirrors (fine control V-bias, such as NBIAS of FIG. 5) and load resistors (fine control R-load, such as resistors R1 and R2 of FIG. 5) by known means of resistor adjustment.

The optimal location for setting a multimode circuit, such as multimode circuit 100, to a converter mode in a path may be determined by one or more variables, such as, but not limited to, an operating condition due to a certain fabrication process, power supply variations, temperature variations, dynamic processes that are executing on the IC chip, operation mode of frequency operating point selections, IC configuration, power dissipation, available power monitoring, and any combinations thereof. In another embodiment, the optimal power level of a multimode circuit (e.g., a multimode circuit set in a limited-swing mode) may be set based on one or more variables, such as, but not limited to, an operating condition due to a certain fabrication process, power supply variations, temperature variations, dynamic processes that are executing on the IC chip, operation mode of frequency operating point selections, IC configuration, power dissipation, available power monitoring, and any combinations thereof. In one example, an optimal location for a multimode circuit to be set in a converter mode may be determined by initializing one or more thermometer code buses so that a signal translation occurs at a first location of a distribution path.

In one example, the thermometer code may be initialized at the center point of a configurable distribution path, such as the center point of distribution path 1010 of FIG. 10 or of configurable distribution path 1200 of FIG. 12. One or more control bits, such as the SEL A/SEL B thermometer code bits, may be adjusted to the point of distribution failure (i.e., the optimum point of conversion in the configurable distribution path), as determined by, for example, the optimization circuits of FIGS. 13, 14, 15, 16, and 17. One or more control bits, such as the SEL A/SEL B thermometer code bits, may be adjusted one position toward the last stage of the distribution path, which increases the limited-swing mode multimode circuits content by at least one stage, in order to guarantee an acceptable distribution performance. Optionally, the power in the limited-swing mode multimode circuits may be decreased by use of the fine control thermometer code buses (or their analog equivalent) until the distribution failure point is again reached. Optionally, the power of the limited-swing mode multimode circuits may be increased by at least one, in order to guarantee acceptable distribution performance.

Example embodiments of mechanisms for determining the optimum point of conversion between, for example, limited-swing mode and full-swing mode along a signal distribution path or tree are provided with reference to the optimization circuits of FIGS. 14, 15, 16, 17, and 18. In one example, optimization of a signal path may optimize power dissipation at a given performance of an integrated circuit having the signal path therein. In one example, a digital controller, such as shown in FIG. 13, may be used in an optimization circuit, such as any one the optimization circuits of FIGS. 14, 15, 16, 17, and 18, in order to generate the control buses based via a single digital input bit.

Figure 14:
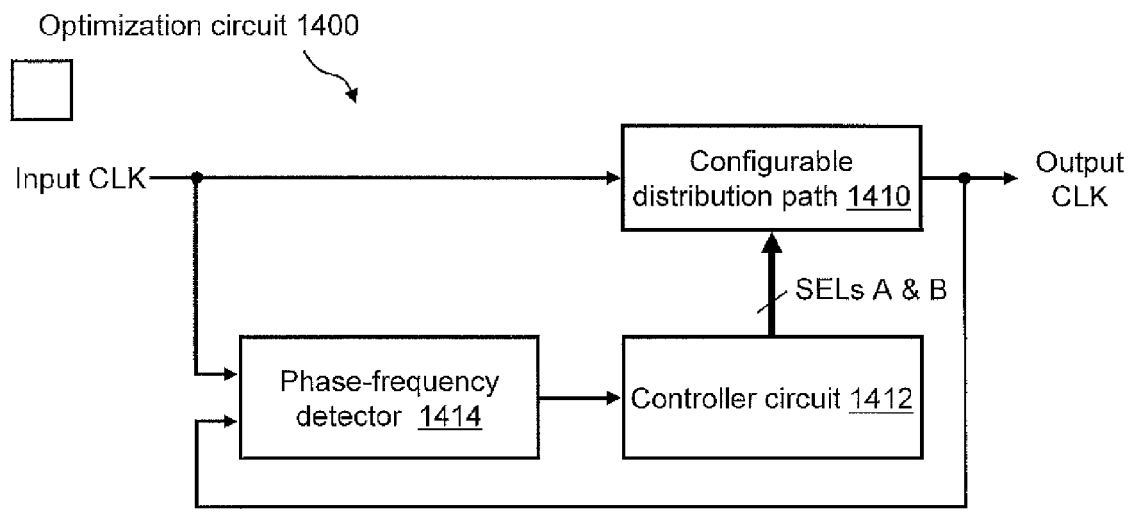
FIG. 14 illustrates a high level block diagram of an example of an optimization circuit that is suitable for determining an optimum point of conversion in a configurable distribution path.

FIG. 14 illustrates a high level block diagram of an example optimization circuit 1400 that is suitable for determining the optimum point of conversion between, for example, limited-swing mode and full-swing mode in a configurable distribution path via a delay-locked loop scheme. Optimization circuit 1400 may include a configurable distribution path 1410, which may be substantially identical to configurable distribution path 1010 of FIG. 10; a controller circuit 1412, which may be substantially identical to controller circuit 1300 of FIG. 13, that provides a set of SELs A and B to configurable distribution path 1410; and a phase-frequency detector 1414. Additionally, an input clock (CLK) feeds an input of configurable distribution path 1410 and an input of phase-frequency detector 1414. An output CLK of configurable distribution path 1410 is fed back to another input of phase-frequency detector 1414. A phase-frequency detector, such as phase-frequency detector 1414, compares the frequency and phase of two signals (e.g., input CLK and output CLK) and generates an output, which feeds controller circuit 1412, that reflects the difference between the signals. An example phase detector may be part of a phase lock loop (PLL) circuit.

In optimization circuit 1400 of FIG. 14, the delay of configurable distribution path 1410 is equated precisely to the period of the input CLK. In doing so, the optimum point of conversion between, for example, limited-swing mode and full-swing mode in a configurable distribution path 1400 is determined. Alternatively, delay or dividers may be inserted into the feedback or feedforward paths in order to modify this relationship, as illustrated in the optimization circuits of FIGS. 15 and 16.

Figure 15:
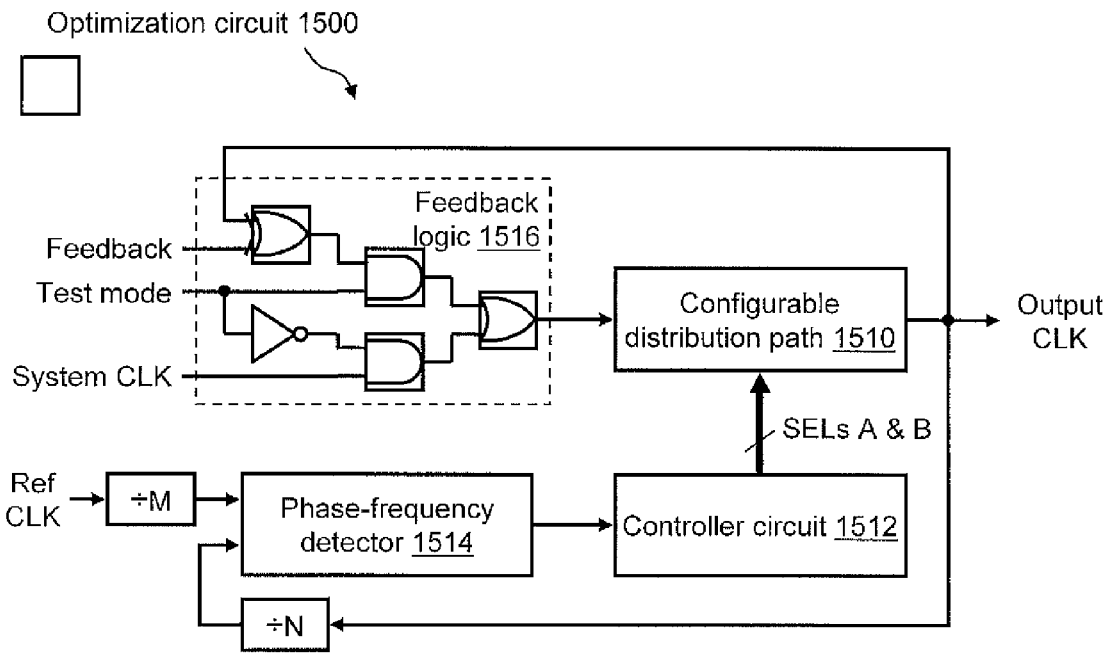
FIG. 15 illustrates a high level block diagram of another example of an optimization circuit that is suitable for determining an optimum point of conversion in a configurable distribution path.

FIG. 15 illustrates a high level block diagram of a another example optimization circuit 1500 that is suitable for determining the optimum point of conversion between, for example, limited-swing mode and full-swing mode in a configurable distribution path via a phase-locked loop scheme. Optimization circuit 1500 may include a configurable distribution path 1510, which may be substantially identical to configurable distribution path 1010 of FIG. 10; a controller circuit 1512, which may be substantially identical to controller circuit 1300 of FIG. 13, that provides a set of SELs A and B to configurable distribution path 1510; a phase-frequency detector 1514, and feedback logic 1516 that is formed of an arrangement of logic gates, as shown in FIG. 15. Additionally, a reference clock (ref CLK) feeds a feed-forward divider ÷M that subsequently feeds an input of phase-frequency detector 1514. Phase-frequency detector 1514 may be, for example, part of a PLL circuit. An output of phase-frequency detector 1514 feeds controller circuit 1512. An output CLK of configurable distribution path 1510 is fed back to another input of phase-frequency detector 1514 via a feedback divider N and also fed back to an input of feedback logic 1516. An output of feedback logic 1516 feeds the input of configurable distribution path 1510. Inputs of feedback logic 1516 may include a feedback signal, a test mode signal, and a system CLK signal.

In optimization circuit 1500, configurable distribution path 1510 is taken out of service as needed and the transition point (e.g., limited-swing to full-swing transition point) is re-optimized. This is accomplished by connecting configurable distribution path 1510 in a loop by activating the test mode signal, adding an inversion if needed, and using the resulting oscillator in a phase-locked loop scheme, which is a negative phase feedback technique for extracting a synchronous clock from an input signal, such as ref CLK. The phase locked loop comprises phase-frequency detector 1514 and feed-forward divider ÷M and feedback divider ÷N. Controller circuit 1512 acts as the loop filter. In this embodiment, assuming that delay in the metal wires of the feedback path is appropriately canceled, this loop forces the delay of configurable distribution path 1510 to match the period of the ref CLK, which is adjusted by the ratio of feed-forward divider ÷M and feedback divider ÷N. In normal operating mode, the loop is disabled and the normal system CLK is applied (via feedback logic 1516) to the input of configurable distribution path 1510.

Figure 16:
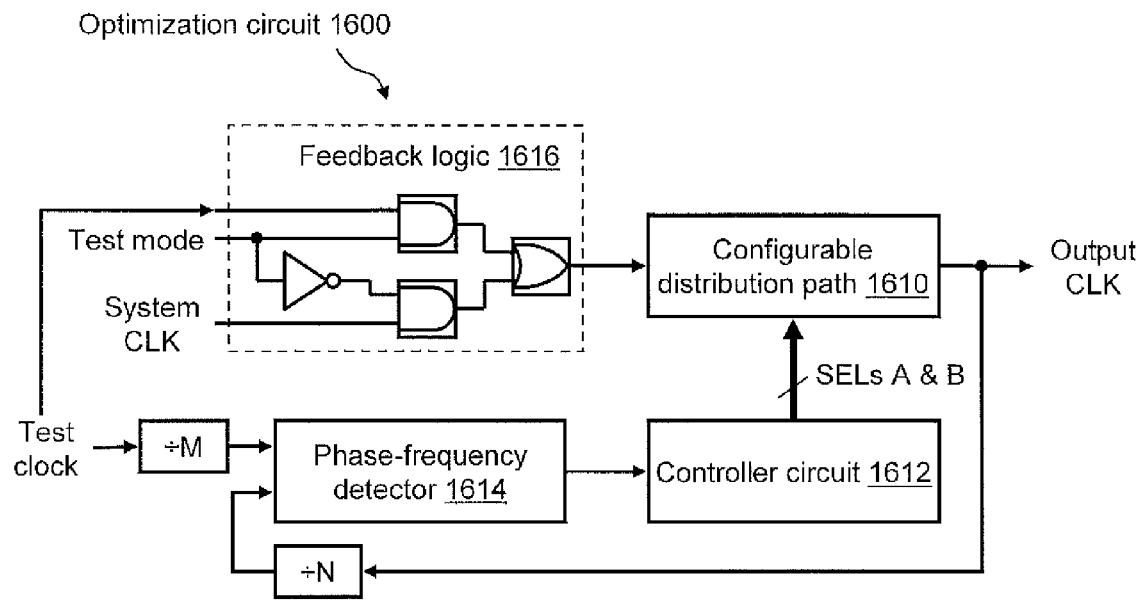
FIG. 16 illustrates a high level block diagram of yet another example of an optimization circuit that is suitable for determining an optimum point of conversion in a configurable distribution path.

FIG. 16 illustrates a high level block diagram of a yet another example optimization circuit 1600 that is suitable for determining the optimum point of conversion between, for example, limited-swing mode and full-swing mode in a configurable distribution path via a delay-locked loop that has a dedicated test clock scheme. Optimization circuit 1600 may include a configurable distribution path 1610, which may be substantially identical to configurable distribution path 1010 of FIG. 10; a controller circuit 1612, which may be substantially identical to controller circuit 1300 of FIG. 13, that provides a set of SELS A and B to configurable distribution path 1610; a phase-frequency detector 1614, and feedback logic 1616 that is formed of an arrangement of logic gates, as shown in FIG. 16. Additionally, a test clock feeds a feed-forward divider ÷M that subsequently feeds an input of phase-frequency detector 1614. The test clock also feeds feedback logic 1616. Phase-frequency detector 1614 may be, for example, part of a PLL circuit. An output of phase-frequency detector 1614 feeds controller circuit 1612. An output CLK of configurable distribution path 1610 is fed back to another input of phase-frequency detector 1614 via a feedback divider ÷N. An output of feedback logic 1616 feeds the input of configurable distribution path 1610. Inputs of feedback logic 1616 may include test clock, a test mode signal, and a system CLK signal.

In optimization circuit 1600, configurable distribution path 1610 is taken out of service as needed and the transition point (e.g., limited-swing to full-swing transition point) is re-optimized. This is accomplished by feeding a known frequency dedicated test clock signal into configurable distribution path 1610. This is done by asserting a test mode signal which gates the system clock off and gates the test clock through to the distribution path 1610. In this embodiment, N times the total delay of configurable distribution path 1610 is matched to M times the period of the dedicated test clock. This allows for substantial flexibility in adapting the overall delay of configurable distribution path 1610. In normal operating mode, the test mode signal is de-asserted and the normal system CLK is applied (via feedback logic 1616) to the input of configurable distribution path 1610.

Figure 17:
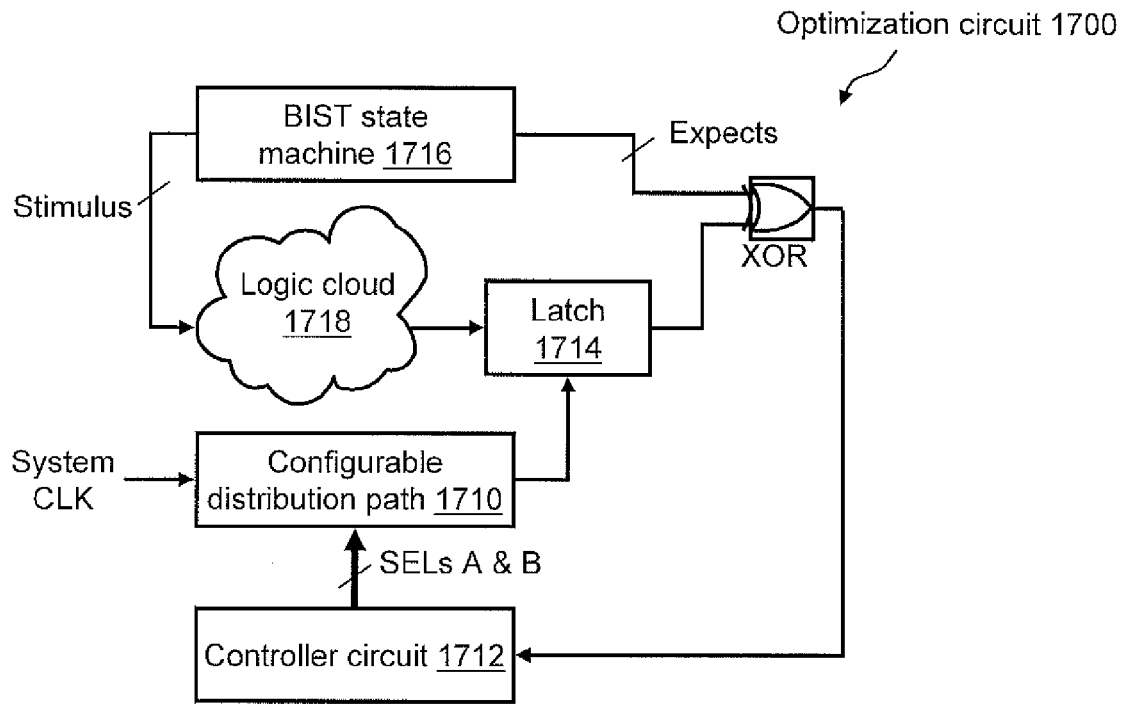
FIG. 17 illustrates a high level block diagram of still another example of an optimization circuit that is suitable for determining an optimum point of conversion in a configurable distribution path.

FIG. 17 illustrates a high level block diagram of a fourth example optimization circuit 1700 that is suitable for determining the optimum point of conversion between, for example, limited-swing mode and full-swing mode in a configurable distribution path via a first built-in-self-test (BIST) scheme. Optimization circuit 1700 may include a configurable distribution path 1710, which may be substantially identical to configurable distribution path 1010 of FIG. 10, and a controller circuit 1712, which may be substantially identical to controller circuit 1300 of FIG. 13, that provides a set of SELS A and B to configurable distribution path 1710. The input to configurable distribution path 1710 may be a system CLK and the output of configurable distribution path 1710 clocks a latch 1714. Additionally, optimization circuit 1700 may include a BIST state machine 1716. BIST state machine 1716 of a standard BIST engine (not shown) provides an integrated circuit, such as integrated circuit 1000 of FIG. 10, the ability to generate internally a sequence of test signals (e.g., stimulus) that are required to verify the functionality of a logic cloud 1718, which may be, for example, a memory array. More specifically, BIST state machine 1716 may execute predetermined test algorithms for generating the required stimulus, such as address and data, for testing logic cloud 1718. Data that appears at the output of logic cloud 1718 is latched by latch 1714 and is compared, via an XOR gate, to a string of expect data (e.g., expects) that is supplied by BIST state machine 1716. The output of the XOR gate is fed back to controller circuit 1712.

Optimization circuit 1700 of FIG. 17 implements an optimization of the delay of configurable distribution path 1710 in order to match the performance of a specific cone of logic. In particular, in optimization circuit 1700, BIST state machine 1716 generates a set of stimuli and a set of "expects" for logic cloud 1718. Input to the digital filter of controller circuit 1712 is a comparison on a bit-by-bit (or vector-by-vector) basis of the expected results vs. the latched result at the output of logic cloud 1718. The delay of configurable distribution path 1710 is adjusted by controller circuit 1712 until all expects from BIST state machine 1616 are matched by values in latch 1714.

Figure 18:
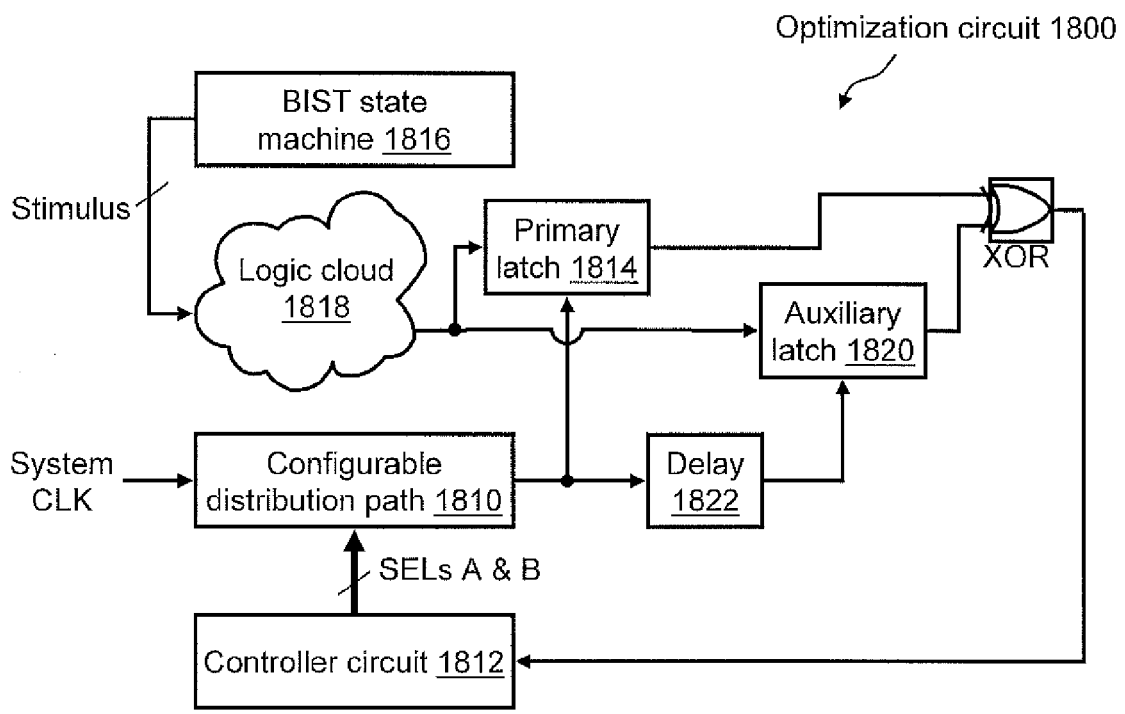
FIG. 18 illustrates a high level block diagram of still yet another example of an optimization circuit that is suitable for determining an optimum point of conversion in a configurable distribution path.

FIG. 18 illustrates a high level block diagram of a fifth example optimization circuit 1800 that is suitable for determining the optimum point of conversion between, for example, limited-swing mode and full-swing mode in a configurable distribution path via a second BIST scheme. Optimization circuit 1800 may include a configurable distribution path 1810, which may be substantially identical to configurable distribution path 1010 of FIG. 10, and a controller circuit 1812, which may be substantially identical to controller circuit 1300 of FIG. 13, that provides a set of SELS A and B to configurable distribution path 1810. The input to configurable distribution path 1810 may be a system CLK and the output of configurable distribution path 1810 clocks a primary latch 1814. Additionally, optimization circuit 1800 may include a BIST state machine 1816. BIST state machine 1816 of a standard BIST engine (not shown) provides an integrated circuit, such as integrated circuit 1000 of FIG. 10, the ability to generate internally a sequence of test signals (e.g., stimulus signals) that are required to verify the functionality of a logic cloud 1818, which may be, for example, a memory array. More specifically, BIST state machine 1816 may execute predetermined test algorithms for generating the required stimulus, such as address and data, for testing logic cloud 1818. Data that appears at the output of logic cloud 1818 is latched by primary latch 1814 and is compared, via an XOR gate, to the output of auxiliary data capture latch 1820 which is clocked by the output of configurable distribution path 1810 that is delayed via a delay 1822. The output of the XOR gate is fed back to controller circuit 1812.

Optimization circuit 1800 of FIG. 18 implements a hold time stress test. In particular, in optimization circuit 1800, the output of logic cloud 1818 is captured into two latches (e.g., primary latch 1814 and auxiliary latch 1820) whose clocks are separated by the delay of delay 1822. In this way, the delay of configurable distribution path 1810 may be adjusted until the contents of primary latch 184 and auxiliary latch 180 match (as indicated by the output of the XOR at a steady low level), which guarantees a hold time of at least the delay of delay block 1822. In this way, BIST state machine 1816 is relieved of the task of creating a set of expects at primary latch 1814, as shown in FIG. 17.

In another embodiment, a performance of an integrated circuit path, such as configurable distribution path 1010 of FIG. 10, that has a multimode circuit, such as multimode circuit 100 of FIG. 1 and with an example embodiment being multimode circuit 200 of FIG. 2, may be controlled dynamically by modifying an operating modes of the multimode circuit therein. In one example, a desired performance level of an integrated circuit path that includes a multimode circuit, such as multimode circuit 100 of FIG. 1, may be determined by measuring an environmental parameter of the integrated circuit path. Example environmental parameters include, but are not limited to, temperature, local voltage, power supply voltage, semiconductor processing parameters, current flow, and any combinations thereof. An operating mode of the multimode circuit may be dynamically switched based on the desired performance level by use of one or more control bits, such as, but not limited to, control signals CML/CMLn, D2SE/D2SEn, and CMS/CMSn. The operating modes include a full-swing mode, a limited-swing mode, a full-swing to limited-swing converter mode, and a limited-swing to full-swing converter mode.

In another embodiment, a performance of an integrated circuit path, such as configurable distribution path 1010 of FIG. 10, that has a one or more multimode circuits, such as plurality of multimode circuits 100 of FIG. 1 and with an example embodiment being multimode circuit 200 of FIG. 2, each multimode circuit may be controlled dynamically by modifying an operating mode of one or more of the multimode circuits therein. In one example, a desired performance level of an integrated circuit path that includes one or more multimode circuits, such as one or more multimode circuits 100 of FIG. 1, may be determined by measuring an environmental parameter of the integrated circuit path. Example environmental parameters include, but are not limited to, temperature, local voltage, power supply voltage, semiconductor processing parameters, current flow, and any combinations thereof. An operating mode of one or more of the multimode circuits may be dynamically switched based on the desired performance level by use of one or more control bits, such as, but not limited to, control signals CML/CMLn, D2SE/D2SEn, and CMS/CMSn. In one example, the operating modes may include a full-swing mode, a limited-swing mode, a full-swing to limited-swing converter mode, and a limited-swing to full-swing converter mode. The optimal location in the integrated circuit path may be determined dynamically for setting an operating mode of one of the plurality of multimode circuits, such as one of the multimode circuits 1011 of configurable distribution path 1010 of FIG. 10, to a converter mode, which is selected from the group of modes that includes a full-swing to limited-swing converter mode and a limited-swing to full-swing converter mode.

In another embodiment, the optimal location of one of the plurality of multimode circuits of an integrated circuit path, such as multimode circuits 1011 of configurable distribution path 1010 of FIG. 10, that is set to a converter mode may be determined by positioning a certain multimode circuit that is configured in either full-swing to limited-swing converter mode or limited-swing to full-swing converter mode in a first location of the plurality of multimode circuits along the integrated circuit path. A performance parameter of the integrated circuit path is measured. In one example, the distribution failure (i.e., the optimum point of conversion in the configurable distribution path), may be determined by optimization technique, such as one of the optimization circuits of FIG. 14, 15, 16, 17, or 18. The location of a certain multimode circuit that is configured in either full-swing to limited-swing converter mode or limited-swing to full-swing converter mode is moved to additional locations along the integrated circuit path until the desired performance level is obtained.

Figure 19:
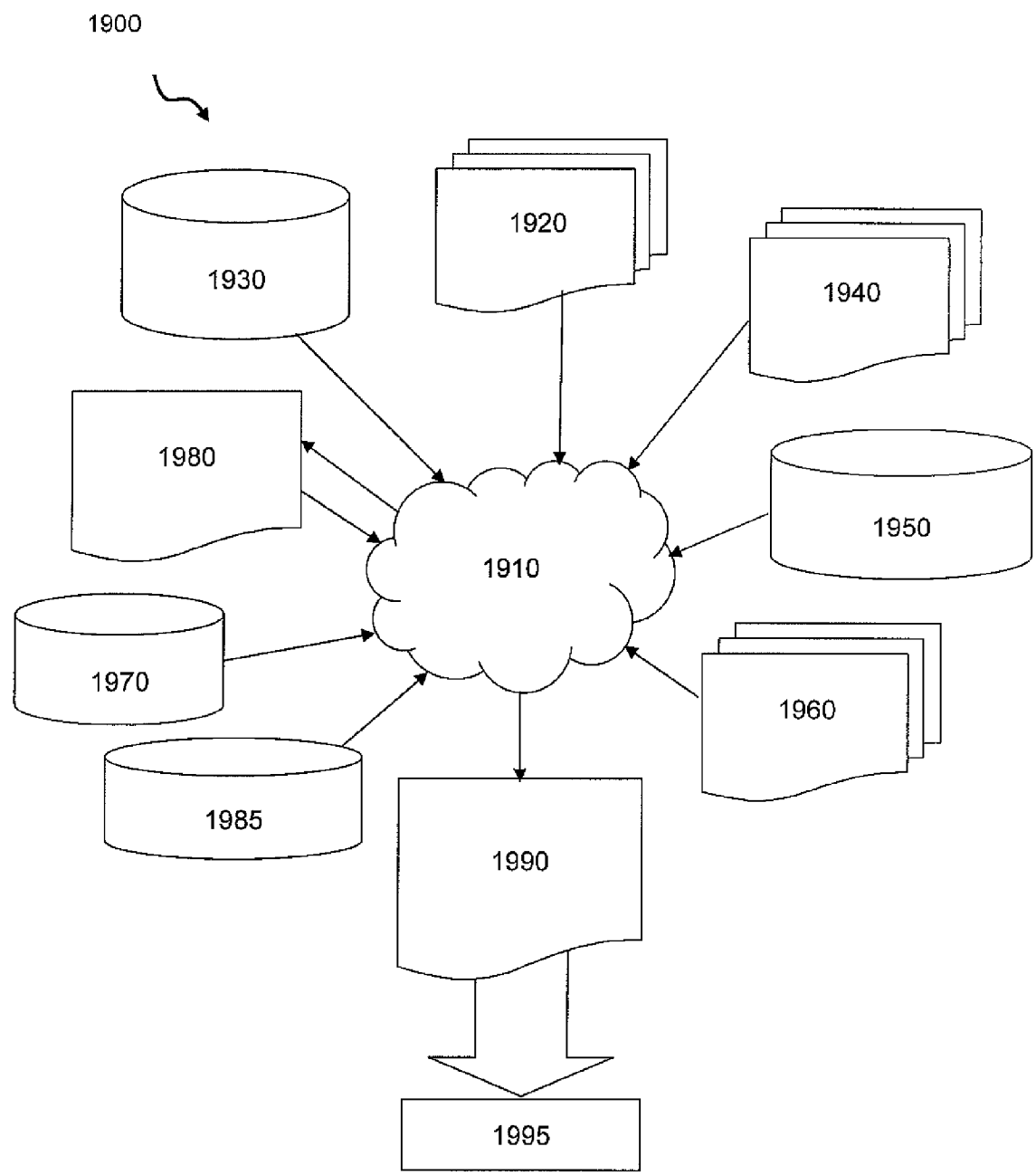
FIG. 19 is a flow diagram of a design process used in semiconductor design, manufacturing, and/or test.

FIG. 19 shows a block diagram of an example design flow 1900. Design flow 1900 may vary depending on the type of IC being designed. For example, a design flow 1900 for building an application specific IC (ASIC) may differ from a design flow 1900 for designing a standard component. Design structure 1920 is preferably an input to a design process 1910 and may come from an IP provider, a core developer, or other design company or may be generated by the operator of the design flow, or from other sources. Design structure 1920 comprises circuit 100 in the form of schematics or HDL, a hardware-description language (e.g., Verilog, VHDL, C, etc.). Design structure 1920 may be contained on one or more machine readable medium. For example, design structure 1920 may be a text file or a graphical representation of circuit 100. Design process 1910 preferably synthesizes (or translates) circuit 100 into a netlist 1980, where netlist 1980 is, for example, a list of wires, transistors, logic gates, control circuits, I/O, models, etc. that describes the connections to other elements and circuits in an integrated circuit design and recorded on at least one of machine readable medium. This may be an iterative process in which netlist 1980 is resynthesized one or more times depending on design specifications and parameters for the circuit.

Design process 1910 may include using a variety of inputs; for example, inputs from library elements 1930 which may house a set of commonly used elements, circuits, and devices, including models, layouts, and symbolic representations, for a given manufacturing technology (e.g., different technology nodes, 32 nm, 45 nm, 90 nm, etc.), design specifications 1940, characterization data 1950, verification data 1960, design rules 1970, and test data files 1985 (which may include test patterns and other testing information). Design process 1910 may further include, for example, standard circuit design processes such as timing analysis, verification, design rule checking, place and route operations, etc. One of ordinary skill in the art of integrated circuit design can appreciate the extent of possible electronic design automation tools and applications used in design process 1910 without deviating from the scope and spirit of the invention. The design structure of the invention is not limited to any specific design flow.

Ultimately, design process 1910 preferably translates circuit 100, along with the rest of the integrated circuit design (if applicable), into a final design structure 1990 (e.g., information stored in a GDS storage medium). Final design structure 1990 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100. Final design structure 1990 may then proceed to a stage 1995 where, for example, final design structure 1990 proceeds to tape-out, is released to manufacturing, is sent to another design house or is sent back to the customer.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A design structure embodied in a machine readable storage medium used in a design process for a method of controlling the performance of an integrated circuit path having a multi-mode circuit dynamically switchable among the following operating modes: a full-swing mode, a limited-swing mode, a full-swing to limited-swing converter mode, and a limited-swing to full-swing converter mode, the design structure of said method comprising:

optimization circuitry configured for determining a desired performance level of the integrated circuit path;

controller circuitry configured for dynamically switching the operating mode of the multi-mode circuit based on said desired performance level;

a first signal input;

a first signal output;

one or more control bit inputs; and an adjustable bias voltage input;

wherein the multi-mode circuit is dynamically switchable among the following operating modes: a full-swing mode, a limited-swing mode, a full-swing to limited-swing converter mode, and a limited-swing to full-swing converter mode.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. A design structure embodied in a machine readable storage medium for performing a method of controlling a performance of an integrated circuit path having a plurality of multi-mode circuits, each of the plurality of multi-mode circuits being dynamically switchable among the following operating modes: a full-swing mode, a limited-swing mode, a full-swing to limited-swing converter mode, and a limited-swing to full-swing converter mode, the design structure of said method comprising:

optimization circuitry configured for:

determining a desired performance level of the integrated circuit path; and dynamically determining the optimal location in the integrated circuit path for setting an operating mode of one of said plurality of multi-mode circuits to a converter mode selected from the group consisting of a full-swing to limited-swing converter mode and a limited-swing to full-swing converter mode; and controller circuitry configured for dynamically switching the operating mode of at least one of the plurality of multi-mode circuits based on said desired performance level.

* * * * *